United States Patent [19]
Iwasaki et al.

[11] Patent Number: 5,804,090
[45] Date of Patent: Sep. 8, 1998

[54] PROCESS FOR ETCHING SEMICONDUCTORS USING A HYDRAZINE AND METAL HYDROXIDE-CONTAINING ETCHING SOLUTION

[75] Inventors: Yasukazu Iwasaki; Norihiko Kiritani, both of Yokosuka; Makiko Mitamura, Fujisawa; Takatoshi Noguchi, Yokosuka; Makoto Uchiyama, Miura, all of Japan

[73] Assignee: Nissan Motor Co., Ltd., Yokohama, Japan

[21] Appl. No.: 617,215

[22] Filed: Mar. 18, 1996

[30] Foreign Application Priority Data

Mar. 20, 1995 [JP] Japan ................................ 7-060259
Nov. 30, 1995 [JP] Japan ................................ 7-312032

[51] Int. Cl.$^6$ ............................. B44C 1/22; H01L 21/306
[52] U.S. Cl. ............................................. 216/99; 438/753
[58] Field of Search ........................ 136/255; 73/514.33; 216/99; 438/753, 745

[56] References Cited

U.S. PATENT DOCUMENTS

| | | | |
|---|---|---|---|
| 3,160,539 | 12/1964 | Hall | 156/17 |
| 4,322,571 | 3/1982 | Stanbery | 136/255 |
| 4,411,735 | 10/1983 | Belani | 156/659.1 |
| 4,941,941 | 7/1990 | Austin et al. | 156/647 |
| 5,594,172 | 1/1997 | Shinobara | 75/514.33 |

FOREIGN PATENT DOCUMENTS

| | | |
|---|---|---|
| 55-48694 | 12/1980 | Japan . |
| 5-27246 | 5/1993 | Japan . |

OTHER PUBLICATIONS

"Si Micro–Machining Advanced Technique", Science Forum Co., Ltd., pp. 120–123.

H. Kishi, et al., "Suppression Method for Micro–Pyramid in Anisotropic Etching of Si", Vacuum, the 29th volume, the second number, pp. 85–91.

Encyclopedia of Chemical Technology Guideline for Safely Treating Hydrazine Hydrate pp. 1–13.

M. Abu–Zeid, "corner Undercutting in Anisotropically Etched Isolation Contours", Electrochem. Soc., vol. 131, No. 9, (1984) pp. 2138–2142.

Shimanoe et al., "An Anisotropic Etching Technology for Fabrication of Integrated Semiconductor Sensors", Toyota Technical Review, vol. 42, No. 2, (1992), pp. 68–75.

A. Horinouchi et al., "Sweep Rate Dependence of I–V Characteristics in Electrochemical Silicon Etch–Stop", Technical Digest of the 9th Sensor Symposium, 1990, pp. 19–22.

M. Theunissen et al., "Appliction of Preferential electrochemical Etching of Silicon to Semiconductor Device Technology", Journal of the Electrochemical Society, vol. 177, pp. 959–1770.

Primary Examiner—John Goodrow
Attorney, Agent, or Firm—Foley & Lardner

[57] ABSTRACT

An etching process for a silicon semiconductor substrate to produce a semiconductor pressure sensor or a semiconductor acceleration sensor. The etching process comprises the following steps: (a) carrying out an etching of the semiconductor without application of a voltage to the semiconductor so as to accomplish a pre-etching step, the pre-etching step including dipping the semiconductor in hydrazine hydrate; and (b) carrying out an electrochemical etching of the semiconductor by applying pre-etching step so as to accomplish a final etching step, the final etching step including dipping the semiconductor in an alkali system etching solution containing at least hydrazine ($N_2H_4$), potassium hydroxide (KOH), and water ($H_2O$), the alkali system etching solution containing potassium hydroxide in an amount of not less than 0.3% by weight.

18 Claims, 20 Drawing Sheets

PROCESS FOR ETCHING SEMICONDUCTORS USING A HYDRAZINE AND METAL HYDROXIDE-CONTAINING ETCHING SOLUTION

BACKGROUND OF THE INVENTION

1. Field of the Invention

This invention relates to improvements in an etching process for a semiconductor, more particularly to an etching process using an etching solution which can provide etch rates different depending upon crystal surface orientations of a semiconductor, a flat etching surface and an etching bottom surface parallel with the main surface of a substrate while suppressing a production cost to a low value.

2. Description of the Prior Art

Hitherto a variety of processes for etching a silicon single crystal substrate by using chemicals have been proposed and put into practical use and generally classified into the following two processes: One of these processes is to etch the silicon substrate by using an acid system (containing an acidic compound) mixture solution containing hydrofluoric acid and nitric acid, and further containing acetic acid or the like, if necessary. The other is to etch the silicon substrate by using an alkali system (containing an alkaline compound) solution such as an aqueous solution of a metal hydroxide exemplified by potassium hydroxide, or hydrazine hydrate. The acid system mixture solution in the former etching process provides an isotropic etch rate regardless of the crystal surface orientation of the silicon single crystal substrate, whereas the alkali system solution in the latter etching process provides an anisopropic etch rate depending upon the crystal surface orientation of the silicon single crystal substrate. Accordingly, the former etching process accomplishes a so-called isotropic etching, whereas the latter etching process accomplishes a so-called anisotropic etching.

In the etching process using the etching solution of a hydrofluoric acid-nitric acid system (containing hydrofluoric acid and nitric acid) which provides the isotropic etch rate regardless of the crystal surface orientation of the silicon single crystal substrate, an etching characteristics is largely affected by the concentration of the nitrite ion contained in a very small amount in the etching solution, and therefore an etching control is difficult. A manner of such an etching control is disclosed, for example, in U.S. Pat. No. 5,266,152 whose inventors include an inventor of the present application. Additionally, in this etching process using the hydrofluoric acid-nitric acid system etching solution, the etching solution has a strong oxidation effect so as to erode even a silicon oxide film, and therefore the material of a mask is required to resist such an erosion in case of accomplishing a deep etching; however, no such a highly erosion-resistive mask material has been founded.

In the etching process using the alkali system solution providing the etch rate depending upon the crystal surface orientation of the silicon single crystal substrate, it is usual to use a silicon oxide film as the mask material. However, the aqueous solution of the metal hydroxide such as potassium hydroxide erodes the silicon oxide film, and therefore it is necessary that the silicon oxide film is formed thick or that a silicon nitride film is used as the mask material as occasion demands, in case of accomplishing the deep etching, for example, made in a production process of a pressure sensor.

The above-mentioned hydrazine hydrate as the alkali system solution has such an excellent etching characteristics as to hardly erode the silicon oxide film, so that a thin silicon oxide film can be used as the mask material even in case of accomplishing the deep etching.

However, in case of etching the silicon single crystal substrate with hydrazine hydrate, the etched surface of the silicon single crystal substrate is not formed flat so that many so-called micro-pyramids (each having the shape of a quadrangular pyramid and constituted of a plane {111}) are formed and appeared on the etching surface of the silicon single crystal substrate which has a main surface of a plane {100}. As a result, not only a flat etching surface cannot be obtained, but also the proceeding of etching may be almost terminated according to cases. Such a micro-pyramid formation problem is not limited to a case of using hydrazine hydrate and generally occurs in cases of using the alkali system anisotropic etching solution such as the aqueous solution of the metal hydroxide exemplified by potassium hydroxide.

The micro-pyramid formation problem is not limited in the case of a non-bias or non-electrolytic etching using the above-mentioned alkali system anisopropic etching solution, and therefore is similarly common in a so-called electrochemical etching in which a voltage is impressed on a semiconductor substrate having p-n junction so as to dissolve only p-type semiconductor layer to leave n-type semiconductor substrate layer. Such an electrochemical etching is, for example, discussed in detail in "Si micromachining advanced technique (Science Forum Co., Ltd.)", pages 120 to 123. Additionally, the electrochemical etching using hydrazine is discussed, for example, in Japanese Patent Publication No. 5-27246.

It may be assumed that a flat surface at which etching is terminated appears at the final stage of the etching even upon using the etching solution causing the micro-pyramids since the etching is terminated at the p-n junction section in the electrochemical etching. However, in fact, it is very difficult to cause the micro-pyramids to disappear on the p-n junction even upon sufficiently carrying out an over-etching. The electrochemical etching is problematic if the electric resistance of the etching solution is high. More specifically, no problem occurs if the etching solution has a very high degree of electrolytic dissociation and therefore has a low electric resistance, like the aqueous solution of the metal hydroxide exemplified by potassium hydroxide. However, problems occur in case that the etching solution is low in electrolyte dissociation degree and high in electric resistance, like hydrazine hydrate. In this case, it is general to add a supporting electrolyte such as potassium chloride into the etching solution in order to prevent fall of electric potential in the etching solution during the electrochemical etching. However, addition of the supporting electrolyte such as potassium chloride to lowering the electric resistance of the hydrazine hydrate liquid further renders the micro-pyramid formation problem predominant. In case of carrying out the electrochemical etching by using only hydrazine hydrate as the etching solution without adding the supporting electrolyte such as the potassium chloride aqueous solution, the etching solution is high in electric resistance and therefore not only the fall of electric potential in the etching solution is large but also the degree of electric potential fall gradually changes in the etching solution since the electric resistance of the etching solution gradually lowers as silicon is dissolved. This renders control of electric potential of the semiconductor substrate very difficult.

For the etching process using hydrazine hydrate, it is necessary to make a treatment to remove natural oxide film existing on the surface of the silicon substrate immediately before carrying out the etching process. This treatment is a pre-treatment with the etching solution of a hydrofluoric acid system (containing hydrofluoric acid). This is because hydrazine hydrate has an etching characteristics to hardly erode the silicon oxide film, and therefore even the natural oxide film exist on the surface of the silicon substrate serves as a mask. Accordingly, for the etching of the silicon substrate, not only the number of treatment steps increases but also a dual etchant (etching solution) system containing acid and alkali systems are used thereby to require two etching facilities. This requires a large-scale automatic production facility thereby largely raising production costs including the depreciation cost. It will be understood that with an etchant system without using the pre-treatment, the number of treatment steps is small while simplifying the facility thereby facilitating the automatization of the etching process. From such view points, it is eagerly desired to obtain an etchant system which hardly erode the silicon oxide film as the mask, smoothly dissolves the natural oxide film and smoothly initiates an etching action for silicon.

Hydrazine hydrate has such a problem as to be low in firing point (firing point: 75.2° C., and ignition point: 77.2° C.). In order to suppress the firing characteristics or raise the firing point of hydrazine hydrate, it is very effective to add water to hydrazine hydrate. This will be discussed with reference to FIG. 7 which shows the relationship between the composition of a hydrazine-water system and the firing point. In FIG. 7, a 100% hydrazine concentration represents anhydrous hydrazine having a water concentration of 0%, whereas a 64% hydrazine concentration represents hydrazine hydrate itself having a water concentration of 36%. The firing point sharply rises as the water concentration increases, so that the firing point does not exist generally in a region where the hydrazine concentration is lower than 40% while the water concentration is higher than 60%. However, addition of water to hydrazine renders the above-mentioned micro-pyramid formation problem more severer, thereby making difficult using hydrazine as the etching solution.

There has been proposed a method for solving the above-mentioned micro-pyramid formation problem which is encountered usually in the etching process using an alkali system anisotropic etching solution, which has been proposed by Kishi et al and disclosed in "Suppression Method for Micro-pyramid in Anisotropic Etching of Si", Vacuum, the 29th volume, the second number, pages 85 to 91 (1986). This method is intended to obtain a flat etched surface without formation of micro-pyramid by defining temperature and concentration of the etching solution in the anisotropic etching for Si under use of a potassium hydroxide aqueous solution or the etching solution of a KOH-$H_2O$ system. However, this etching solution is an alkali metal hydroxide aqueous solution per se and therefore has the following etching characteristics: From the view point of selectivity of materials for the mask, the etching solution erodes the silicon oxide film, and therefore it is required to form a very thick silicon oxide film or to use a silicon nitride film as the material of the mask as occasion demands in case of carrying out a deep etching having an etching depth corresponding generally to the thickness of the semiconductor substrate. However, formation of the very thick silicon oxide film is not practical because it requires a longer time as the thickness of silicon oxide film increases, according to a so-called square rule in which the thickness of silicon oxide film is proportional to the square root of a thermal oxidation time for formation of the oxide film.

Another proposition of solving the micro-pyramid formation problem is disclosed, for example, in Japanese Patent Publication No. 55-48694, which features an etching method in which a semiconductor is etched by using an etching solution prepared by mixing 1 part by volume of hydrazine hydrate and 0.5 to 1 part by volume of anhydrous ethylenediamine. This publication states the following technique: An anisotropic etching can be made in which etch rate is different depending upon the crystal orientation of a semiconductor substrate to be etched. No quadrangular pyramid is formed at the etching surface thereby to form a flat mirror-like surface. Additionally, a sufficient mask effect can be accomplished with a thin oxide film. However, the following difficulties are encountered in the proposition disclosed in the publication: First, there is such a problem that the firing point of the etching solution is low. The firing point of hydrazine hydrate as one component of the etching solution has been discussed above, and the firing point of anhydrous ethylenediamine as the other component is 34° C. which is lower than that of hydrazine hydrate. This anhydrous ethylenediamine in a vapor state forms a mixture gas fallen within a combustible range upon being mixed with air, and is required to be more carefully treated than hydrazine hydrate. The etching solution is the mixed solution constituted of only hydrazine hydrate and anhydrous ethylenediamine and therefore never contains water, so that its firing point is appeared to be generally equivalent to that of hydrazine hydrate or anhydrous ethylenediamine which is the component of the etching solution.

Additionally, the above publication states that no quadrangular pyramid is formed at the etching surface thereby to form a flat mirror-like surface, as discussed above; however, this never means that the etching bottom surface is parallel with the surface of the substrate. For example, in case of conducting an etching in a square pattern on a silicon substrate which square pattern is constituted of the main surface of a plane $\{100\}$ and surrounded by sides in a direction of an axis <110>. The resultant etching surface is constituted of side surface of plane $\{111\}$, a bottom surface of a plane $\{100\}$, and a gently inclined surface (having a slope of about $1/36$) which surrounds the bottom surface of the plane $\{100\}$ and contiguous to the side surface of the plane $\{111\}$. As the etching proceeds, the bottom surface of the plane $\{100\}$ is minimized and therefore the gently inclined surface of the plane having the slope of about $1/36$ occupies the major part of the etching bottom surface.

Finally, the bottom surface of the plane $\{100\}$ is disappeared, and accordingly the etched surface is constituted by the side surface of the plane $\{111\}$ and the gently inclined surface which is contiguous to the plane $\{111\}$ and has the slope of about $1/36$. This results in the following: On the assumption that the design of a diaphragm is made such that the diaphragm has a length of 500 $\mu$m in each side and an average thickness of 10 $\mu$m, the diaphragm is formed to have the thickness of the thinnest part being about 3 $\mu$m and the thickness of the thickest part of the diaphragm being about 17 $\mu$m. In other words, the etching solution has such a characteristics that an ununiformity in thickness of the diaphragm reached $\pm 70\%$. In case of forming the diaphragm by controlling the time of etching, it is preferable that the etching bottom surface becomes parallel with the main surface of the silicon substrate. From this view point, the etching solution of this etchant system is not so desirable. Such a problem of forming the gently inclining surface is common in the etching process using hydrazine anhydrate.

The etch rate of this etching process is very slow, i.e., about $1/6$ of that in case of using hydrazine hydrate at the same processing temperature. Accordingly, in case of accomplishing a deep etching, for example, in a production process of a semiconductor pressure sensor, the processing time is too long. In case of producing the semiconductor substrate, the time required for etching reaches about 24 hours, so that the etching process cannot be terminated for a full one day, taking account of a time required for raising the temperature of the etching solution, a time required for rinsing a wafer or the semiconductor substrate, and a time required for handling the wafer. Additionally, hydrazine hydrate and anhydrous ethylenediamine are low in degree of electrolytic dissociation as they are, and therefore the etching solution constituted of them is high in electric resistance, so that it is difficult to use the etching solution for the electrochemical etching unless the supporting electrolyte such as potassium chloride is added thereto. Additionally, anhydrous ethylenediamine is usually used as chemicals for chemical experiments and not used as chemicals for electronics industry. Accordingly, the purity of anhydrous ethylenediamine is questionable so that there is the fear of containing impurities which will affect the electric characteristics of electronic devices.

As discussed above, in the conventional anisotropic etching process for the silicon single crystal substrate using hydrazine hydrate, many micro-pyramids are formed at the etching surface so as not to provide a flat etching surface although hydrazine hydrate has such an excellent characteristics as to hardly erode the silicon oxide film. Additionally, the etching per se may be terminated in particular cases. Further, there is the problem that the etched surface becomes not parallel with the main surface (at which etching is initiated) of the semiconductor substrate and forms the gently inclined surface. Furthermore, in the electrochemical etching process, it is required to add the supporting electrolyte such as potassium chloride or the like to the etching solution in order to lower the electric resistance in the etching solution. This addition of the supporting electrolyte makes the micro-pyramid formation problem further predominant. If the electrochemical etching is made without addition of the supporting electrolyte and by using only hydrazine hydrate as the etching solution, the etching solution is high in electrical resistance and therefore not only a potential fall occurs in the etching solution but also the electrical resistance of the etching solution gradually changes as silicon dissolves in the etching solution. This makes it difficult to control the electric potential at the semiconductor substrate. Further, it is required to carry out the pre-treatment to remove the natural oxide film as the mask, thereby raising the production cost. Furthermore, hydrazine hydrate has the problem of having a low firing point and is dangerous.

SUMMARY OF THE INVENTION

It is an object of the present invention to provide an improved etching process for a semiconductor, which can overcome drawbacks encountered in conventional etching processes for a semiconductor.

Another object of the present invention is to provide an improved etching process for a semiconductor, by which an etching surface is formed flat and has an etching bottom surface parallel with the main surface of a silicon semiconductor while etch rates are different depending upon crystal surface orientation of a silicon semiconductor.

A further object of the present invention is to provide an improved etching process for a semiconductor, which uses an etching solution which is high in etch rate of silicon, very low in degree of eroding a silicon oxide film as a mask, high in firing point, low in electric resistance, and can be employed in electrochemical etching without addition of a supporting electrolyte.

A still further object of the present invention is to provide an improved etching process for a semiconductor, which accomplishes an anisotropic etching at a high efficiency and accuracy by using an alkali system etching solution without using a pre-treatment for removing a natural oxide film or the like.

Throughout a variety of experiments, the present inventors have found that it is possible not only to prevent formation of micro-pyramids at the etching surface of the semiconductor but also to improve and control the etching characteristics of hydrazine hydrate, i.e., the mask material selectivity, the etch rate to crystal orientation dependency and the like, by adding the aqueous solution of a metal hydroxide such as potassium hydroxide to hydrazine hydrate which is the excellent anisotropic etching solution for the semiconductor. This will be discussed in detail hereinafter.

Concerning the micro-pyramid formation problem encountered generally in the etching process using the alkali anisotropic etching solution, a micro-pyramid development mechanism has not yet been able to be sufficiently made clear. However, the development or formation of the micro-pyramid is supposed to be result from repetition of formation and disappearance of the micro-pyramid during the etching so that the shape and flatness of the etching surface depends on growth and sifting of the micro-pyramid. Additionally, the phenomena of formation of the micro-pyramid is presumed to be caused under the effect of nucleus existing at the summit of the micro-pyramid and serving as an etching mask. This nucleus is supposed to be formed from, for example, (a) oxygen deposited in the silicon substrate, (b) crystal defect other than the nucleus formed of the deposited oxygen, in the silicon substrate, (c) particulate existing in the etching solution and attached to the etched surface, and (d) ion and molecular in the etching solution, attached on the etching surface upon specific absorption. It is supposed that the above-mentioned (a) is cluster of silicon oxide system; the above-mentioned (c) is mainly silicon oxide system (containing mainly silicon oxide) compounds such as polysilicate which is silicon dissolved in the etching solution, or a lifted-off part of the oxide mask. The above-mentioned (d) is supposed to be alcohols added in the etching solution for the purpose of controlling the characteristics of the anisotropic etching, or silicon dissolved in the etching solution, for example, monosilicate or polysilicate. Anyway, it is supposed that the compounds of the silicon oxide system serves as main nucleus acting as the etching mask to cause the micro-pyramid to be grown. In view of the above, the present invention is intended to overcome the above-mentioned micro-pyramid formation problem, which is supported to be accomplished by the following: A potassium hydroxide aqueous solution which serves as an alkali anisotropic etching solution and erodes oxide is added to hydrazine hydrate as a main component of the etching solution, thereby breaking the balance of the formation and disappearance of the above-mentioned micro-pyramid while maintaining the major etching characteristics of hydrazine hydrate which is an excellent anisotropic etching solution. This suppresses the formation phenomena of the micro-pyramid and assists disappearance of the micro-pyramid, thus providing a flat etching surface without formation of the micro-pyramid.

In an electrochemical etching, the etching is terminated at a section in which p-n junction is formed, and therefore it may be supposed that a flat etching surface at which the etching is terminated is finally appeared. However, in fact, it is difficult to vanish the micro-pyramid on the p-n junction even upon applying a sufficient over-etching. Although the termination mechanism of the etching in electrochemical etching has not yet been sufficiently made clear, it is generally supposed that the etching is terminated upon formation of an oxide film (by anodic oxidation) at the surface of the silicon substrate. The electrochemical etching is a process in which only p-type silicon substrate is dissolved while leaving n-type silicon substrate by using the difference in electric potential depending upon conductivity type of semiconductor at an electric potential (passivation potential), and therefore it is expected that the etching terminates at the etching termination surface corresponding to the p-n junction surface; however, it is in fact complicated. If the micro-pyramid exists when the etching proceeds to the vicinity of the p-n junction, room light, cosmic ray, radioactive rays or the like reach p-n junction thereby to form an electron-hole pair, or leak current flows through the micro-pyramid as a p-type silicon semiconductor on the p-n junction owing to existence of a micro-defect so that the micro-pyramid comes into an etching terminating mode. As a result, it is supposed that the micro-pyramid on the p-n junction cannot be disappeared even if the over-etching is sufficiently applied. Anyway, it is expected that the micro-pyramid does not exist when the etching proceeds to the vicinity of p-n junction. In the electrochemical etching using the etching solution according to the present invention, the micro-pyramid will not exist at the etching termination surface, and therefore the flat etching termination surface can be obtained.

Additionally, the etching solution according to the present invention is prepared by adding the metal hydroxide aqueous solution to hydrazine hydrate. In other words, this means that water is added to hydrazine hydrate, and therefore the firing point of the etching solution rises so that no firing point will exist according to mixing ratios between it and water. Further, the etching solution according to the present invention contains not only water but also the aqueous solution of the metal hydroxide such as potassium hydroxide which are very high in electrolytic dissociation. Accordingly, the etching solution of the present invention is sufficiently low in electric resistance regardless of the fact that any supporting electrolyte such as potassium chloride is not added thereto.

According to an aspect of the present invention, an etching process for a semiconductor comprises the following steps: (a) preparing an alkali system etching solution containing at least hydrazine ($N_2H_4$), a metal hydroxide (MOH), and water ($H_2O$), the alkali system etching solution containing the metal hydroxide in an amount of not less than 0.3% by weight; and (b) dipping the semiconductor in the etching solution to etch the semiconductor.

By virtue of using the above etching solution of the present invention, the anisotropic etching can be made in which etch rates are different depending upon the crystal surface orientation of the silicon semiconductor, like with the alkali anisotropic etching solution such as anhydrous hydrazine or hydrazine hydrate. Additionally, unevenness such as many micro-pyramids (quadrangular pyramids) are not formed at the etching surface thereby forming the flat etching surface while providing the etching bottom surface which is parallel with the main surface of the silicon substrate. For example, in case of forming a diaphragm by controlling time of etching, the upper surface (the back-side surface of the silicon substrate to be etched and opposite to the main surface of the silicon substrate) and the lower surface (the etched bottom surface of the silicon substrate to be etched) of a semiconductor substrate are flat and parallel with each other, so that the diaphragm having a uniform thickness can be obtained. Additionally, the etching solution has a high firing point relative to anhydrous hydrazine or hydrazine hydrate or has no firing point, and therefore makes possible it to carry out the etching process without an excessive care for handling the etching solution. The etching solution of the present invention is low in electric resistance, and therefore it can be used for the electrochemical etching without addition of the supporting electrolyte such as potassium chloride. The etching solution of the present invention is constituted of the readily available chemicals having a low sodium concentration, so that it can readily prepared to be low in concentration of sodium which will deteriorate an electric characteristics of an electronic device to be produced. Further, the etching process according to the present invention does not requires a pre-treatment step for removing a natural oxide film on the semiconductor substrate, thereby simplifying the etching process. This also simplifies a facility for accomplishing the etching process and facilitates the automatization of the etching process, thus suppressing to a low value a production cost including a depreciation cost of the facility.

According to another aspect of the present invention, an etching process for a semiconductor comprises the following steps: (a) carrying out an etching of the semiconductor without application of a voltage to the semiconductor so as to accomplish a first etching step; and (b) carrying out an electrochemical etching of the semiconductor by applying a voltage to the semiconductor after the first etching step so as to accomplish a second etching step.

By virtue of the fact that the etching process comprises the first etching step (pre-etching step) and the second etching step (final etching step), a process cost including equipment investment cost and labor cost can be reduced thereby lowering a production cost of semiconductor devices. In case that the etching solution and/or reaction products are flammable and explosive during the electrochemical (final) etching step, a risk can be largely reduced. In case that the etching solutions used respectively at the pre-etching and final etching steps are different from each other, the following advantages are attained: The degree of freedom in designing the production process can be improved. Even upon using the same mask, different final shapes of the semiconductor device and a series of semiconductor devices having different characteristics can be obtained. A trimming characteristics for the semiconductor device characteristics can be improved. Additionally, a term required for research and development of the semiconductor device can be shortened while reducing a production cost of the semiconductor device which cost includes a cost of material to be consumed. If the pre-etching step is carried out by using the etching solution providing a high etch rate and under a condition providing a high etch rate, the following advantages can be attained: The throughput of the semiconductor device can be improved. The etching treatment time required for each semiconductor substrate can be reduced, thereby shortening a time for which an etching apparatus is occupied. Additionally, a process cost including labor cost can be lowered, thereby effectively lowering the production cost of the semiconductor device. If the pre-etching step uses the etching solution which has been used in other steps such as the final etching step, the number of the semiconductor substrates to be treated per unit volume of the etching solution can be largely increased thereby lowering the cost of raw materials to be consumed in the etching process, thus finally reducing the production cost of the semiconductor device.

A further aspect of the present invention resides in an etching process for a semiconductor. The etching process comprises the following steps: (a) carrying out an etching of the semiconductor without application of a voltage to the semiconductor so as to accomplish a first etching step, the first etching step including dipping the semiconductor in hydrazine hydrate; and (b) carrying out an electrochemical etching of the semiconductor by applying a voltage to the semiconductor after the first etching step so as to accomplish a second etching step, the second etching step including dipping the semiconductor in an alkali system etching solution containing at least hydrazine ($N_2H_4$), potassium hydroxide (KOH), and water ($H_2O$), the alkali system etching solution containing potassium hydroxide in an amount of not less than 0.3% by weight.

BRIEF DESCRIPTION OF THE DRAWINGS

In the drawings, like reference numerals designate like elements and parts throughout all figures, in which.

DETAILED DESCRIPTION OF THE INVENTION

Figure 1:
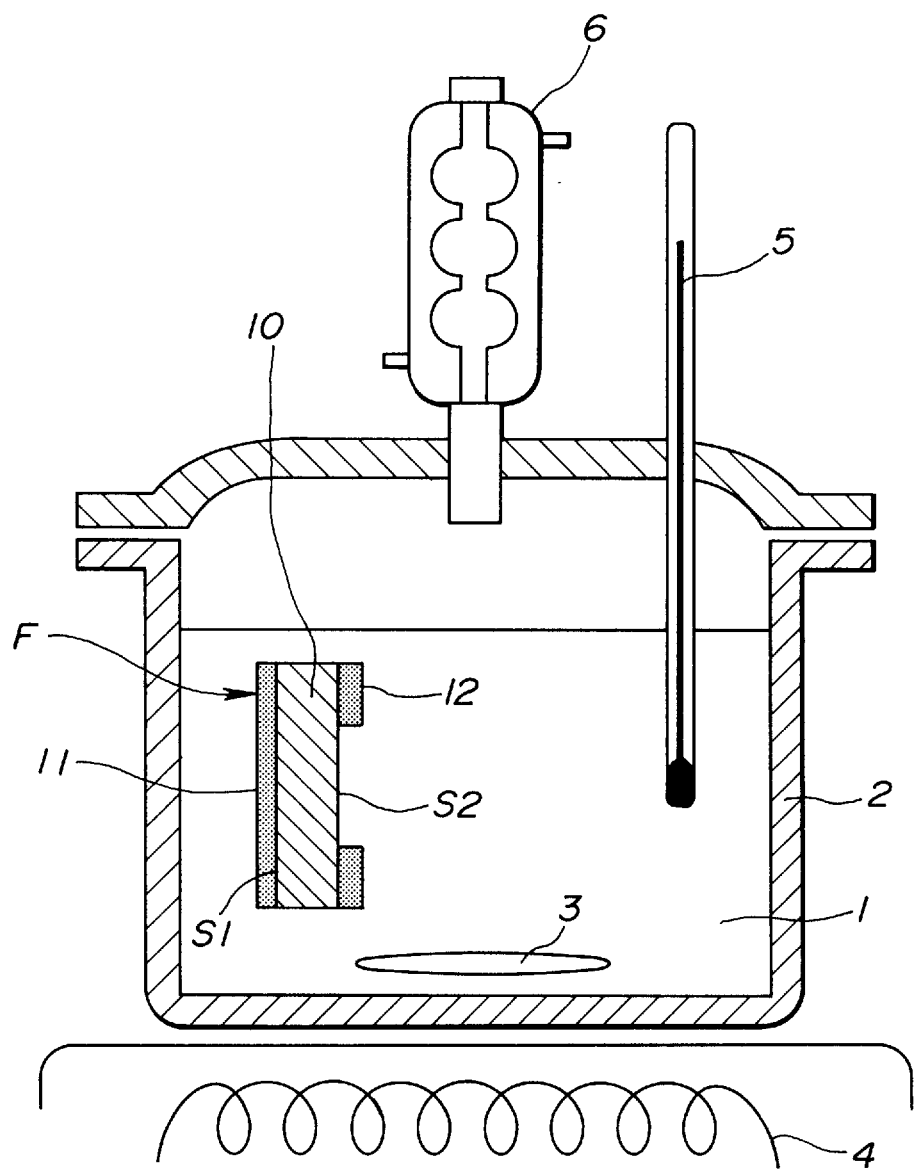
FIG. 1 is a schematic illustration of an etching apparatus for carrying out a first embodiment of an etching process according to the present invention.

Referring now to FIG. 1, a first embodiment of an etching process for a semiconductor, according to the present invention will be discussed. This etching process is forms part of a method of producing a diaphragm type semiconductor pressure sensor, and more specifically for forming a diaphragm by etching under a time control. FIG. 1 shows-an etching apparatus for accomplishing etching for the semiconductor. The etching apparatus comprises an etching vessel 2 which is filled with an etching solution 1 of the alkali system (containing an alkaline compound). The etching solution contains at least hydrazine ($N_2H_4$), a metal hydroxide (MOH), and water ($H_2O$). The etching solution contains potassium hydroxide in an amount of 0.3% by weight. A magnetic stirrer bar 3 is put on the bottom surface of the etching vessel and in the etching solution 1 to stir the etching solution 1. A heater 4 is disposed under the etching vessel 2 to heat the etching solution 1. A thermometer 5 is dipped in the etching solution 1 to measure the temperature of the etching solution 1. A condenser or cooling tube 6 is disposed so that vapor of the etching solution 1 is introduced thereinto to be cooled and condensed to liquid to be returned into the etching vessel 2. An impeller (not shown) may be disposed in the etching solution to be rotated by a motor (not shown) located outside the etching vessel 2. The temperature of the etching solution 1 may be controlled under a PID control, though not shown.

A fabricated structure F is dipped in the etching solution 1 to be subjected to etching with the etching solution 1. The structure F includes a silicon substrate 10 which is provided with a silicon oxide film 11 at its main surface S1 (having a plane {100}) and a silicon oxide film 12 at its back-side surface S2. The silicon oxide films 11, 12 have been formed by thermal oxidation or by CVD (Chemical Vapor Deposition). The back-side surface S2 serves as a surface from which the etching is initiated or starts, and therefore referred to as an etching-initiation surface. The silicon oxide film 12 on the etching-initiation surface S2 has been arranged such that a part for covering a region (not to be etched) of the etching surface S2 is left while the other part for covering the other region (to be etched) of the etching-initiation surface S2 is removed, thereby taking the shape as shown in FIG. 1. During the etching of the structure F including silicon substrate 10, an etching time is controlled to obtain a required etching depth (the depth of depression formed by the etching), i.e., the thickness of the diaphragm formed by being not etched.

Figure 2A:
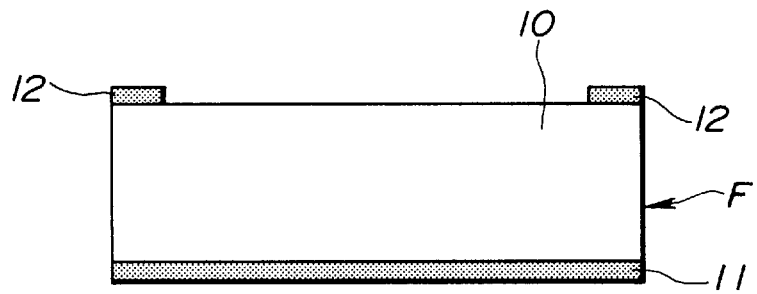
FIG. 2A is a schematic sectional view of a fabricated structure to be etched in the etching apparatus of FIG. 1.

The etching process using the etching apparatus shown in FIG. 1 will be discussed in detail with reference to FIG. 2A to 2E, in which the fabricated structure F as shown in FIG. 2A is subjected to the etching. The structure F takes etching-shapes as shown in FIGS. 2B to 2E upon being subjected to the etching under various conditions.

Figure 2B:
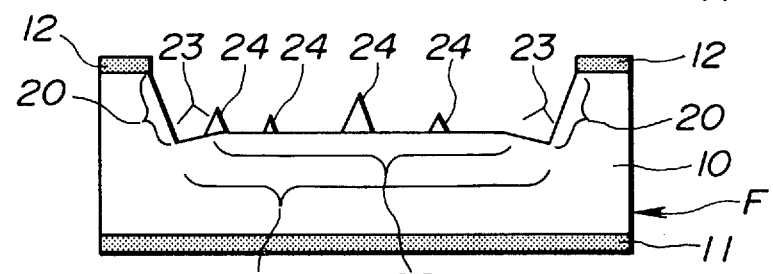
FIG. 2B is a schematic sectional view showing an etching shape of the fabricated structure of FIG. 2A, formed under a temporary etching by an etching process using hydrazine hydrate as the etching solution.

FIG. 2B shows the shape (etching shape) of the structure F upon being subjected to the etching at a certain degree under a condition in which the etching solution is hydrazine hydrate, and the etching temperature (the temperature of the etching solution) is 80° C. The etched structure F has an etching depression (not identified) which is defined by an etching side wall 20 of a plane {111} which is characteristic in an alkali anisotropic etching, and an etching bottom surface 21. The etching bottom surface 21 includes a flat surface 22 of a plane {100}, and a gently sloping surface 23 of a plane {111} which surface 23 is continuous to the etching side surface 20. Many micro-pyramids are formed on the etching bottom surface 21. In this case, a pre-treatment with a hydrofluoric acid system etchant has been carried out for the structure F prior to the etching in order to remove the natural oxide film on the structure F.

In case of not carrying out the pre-treatment, the etching cannot proceed at all.

Figure 2C:
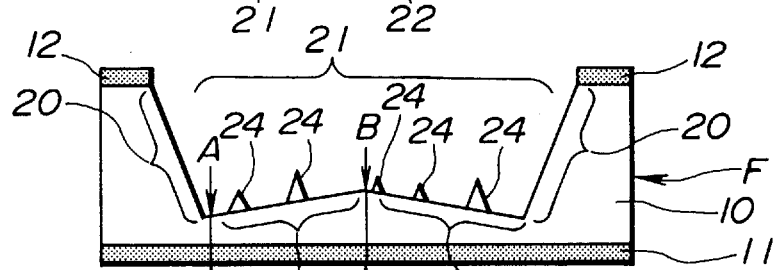
FIG. 2C is a schematic sectional view showing another etching shape of the fabricated structure of FIG. 2A, formed under a further etching made on the etching shape of FIG. 2B by the etching process using hydrazine hydrate as the etching solution.

FIG. 2C shows the etching shape of the structure F of FIG. 2B upon being subjected to a further etching thereby forming the diaphragm (not identified). In the etching bottom surface 21 forming part of the diaphragm, the above-mentioned bottom surface 22 of the plane {100} shown in FIG. 2B disappears, and therefore the etching bottom surface 21 is constituted of only gently sloping surfaces 23, 23 which are continuous to the etching side surfaces 20. Many micro-pyramids 24 are formed also on the surfaces 23, 23. The etching shape is changed through that shown in FIG. 2B to that shown in FIG. 2C, during which the micro-pyramids repeat their formation and disappearance so as to exist in their random sizes and at random locations. The size of each micro-pyramid 24 is generally several to several tens μm and reaches a value exceeding 100 μm according to cases. It will be understood that the thus formed etching shape cannot provides the diaphragm (having a thickness of from several to several tens μm) of the semiconductor pressure sensor.

Figure 2D:
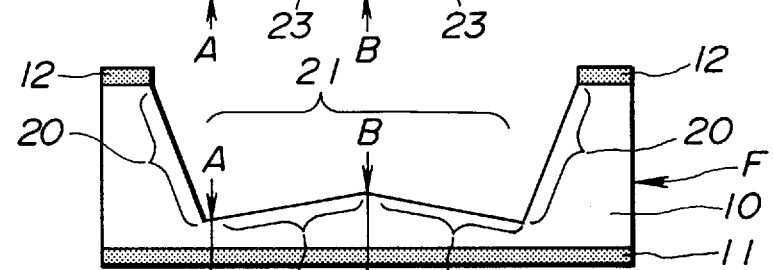
FIG. 2D is a schematic sectional view showing an etching shape of the fabricated structure of FIG. 2A, formed under etching by an etching process using a mixture of hydrazine hydrate and anhydrous ethylenediamine as the etching solution.

FIG. 2D shows the etching shape of the structure F upon being subjected to the etching using the etching solution which has been prepared by mixing 1 part by volume of hydrazine hydrate and 0.5 to 1 part by volume of anhydrous ethylenediamine, thereby forming the diaphragm of the semiconductor pressure sensor, as disclosed in Japanese Patent Provisional Publication No. 55-48694. The etching shape of this case is such that although the micro-pyramids are not formed, the etching bottom surface 21 is constituted of only gently sloping surfaces 23, 23 which are continuous to the etching side surfaces 20 of the plane {111}. For example, in case that the etching is carried out at 80° C. using the etching solution prepared by 1 part by volume of hydrazine hydrate and 1 part by volume of anhydrous ethylenediamine, the slope of the gently sloping surface 23 is ⅟36 while the etch rate is 0.3 μm/min. Additionally, in case of producing a diaphragm whose each side has a dimension of 500 μm by controlling the etching time, the etching time of 27 hours is required, and the deepest etched portion (having a thickness of 3 μm) is positioned at a linear location at which the etching bottom surface 21 meets the etching side surface 20 of the plane {111} as indicated by a line A—A in FIG. 2D while the shallowest etched portion (having a thickness of 17 μm is positioned at a central part of the diaphragm as indicated by a line B—B in FIG. 2D, so that the ununiformity in thickness of the diaphragm reaches a value of ±70%. In this case, a pre-treatment with a hydrofluoric acid system etchant is necessary and has been carried out for the structure F prior to the etching in order to remove the natural oxide film on the structure F.

Figure 2E:
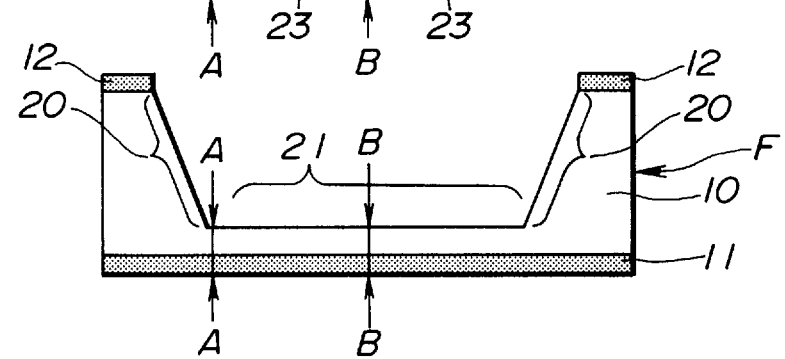
FIG. 2E is a schematic sectional view showing an etching shape of the fabricated structure of FIG. 2A, formed under etching by an etching process according to the present invention.

FIG. 2E shows the etching shape of the structure F upon being subjected to the etching using the etching solution of the present invention. This etching shape is arranged such that not only the micro-pyramid which is characteristics in the etching shapes of FIGS. 2B and 2C is never formed but also the etching bottom surface 21 is formed parallel with the etching-initiation surface S2 from which etching is initiated. In this case, the etching is carried out, for example, at 80° C. using the etching solution prepared by mixing 5 parts by volume of hydrazine hydrate and 4 parts by volume of 20 wt % KOH aqueous solution. In this etching, the etch rate is 1.2 μm/min while the etching bottom surface 21 is formed completely flat so as to have a flatness lower than a measurable limit of a tracer method using a contacting needle. Additionally, the etching bottom surface 21 is formed parallel with the etching-initiation surface at which the etching has been initiated, so that existence of the gently sloping surface 23 is not recognized. The ununiformity in thickness of the diaphragm largely depends on the degree of parallelization of the main and back-side surfaces S1, S2 of the silicon substrate 10, i.e., on the degree of grinding and polishing made on the silicon substrate 10. Additionally, the etching time required for the etching is ¼ of that in case of the above etching process using the etching solution prepared by mixing 1 part by volume of hydrazine hydrate and 1 part by volume of anhydrous ethylenediamine. Furthermore, in this case, a pre-treatment with a hydrofluoric acid system etchant is unnecessary and has not been carried out for the structure F prior to the etching.

Figure 3:
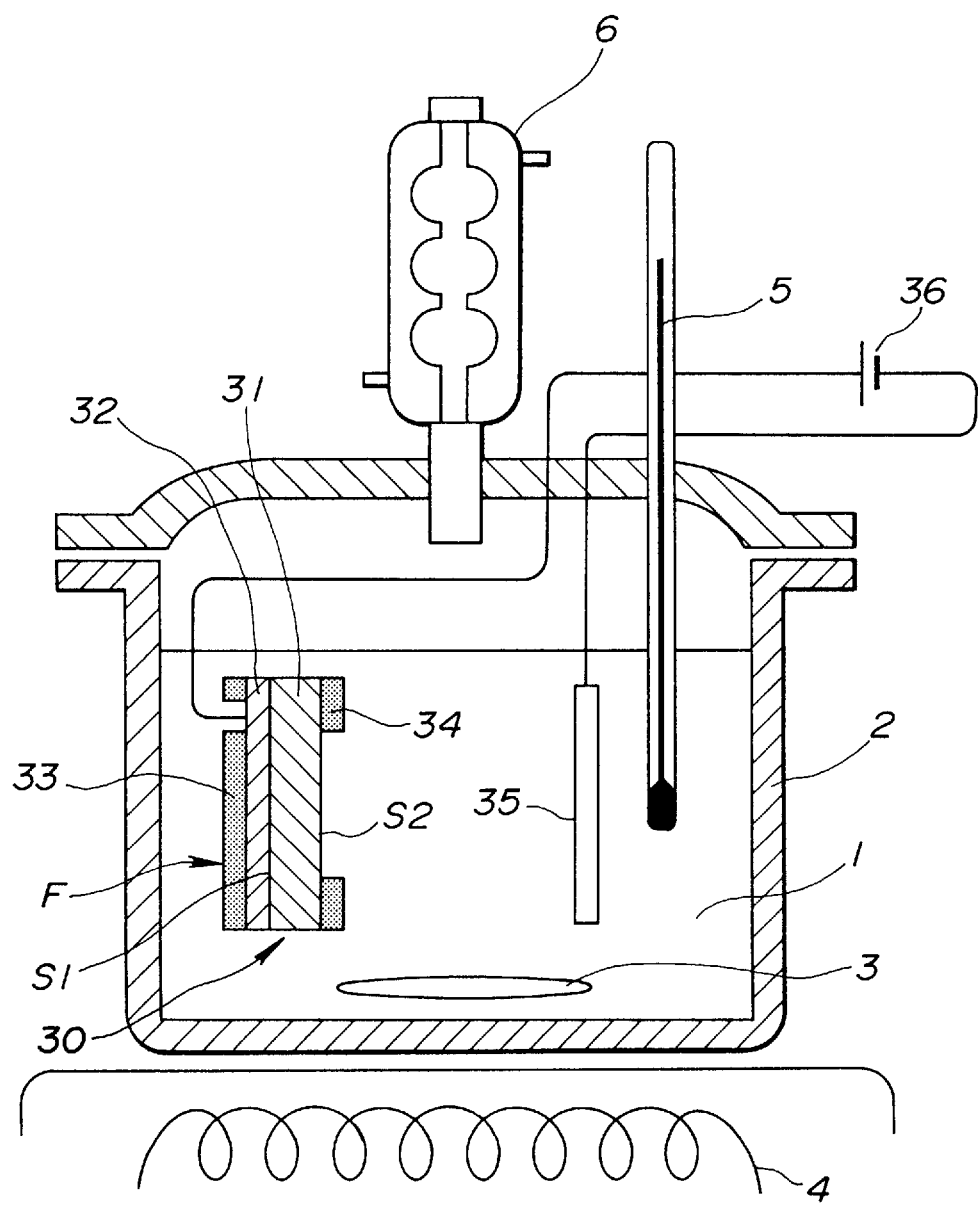
FIG. 3 is a schematic illustration of an etching apparatus for carrying out a second embodiment of the etching process according to the present invention.

FIG. 3 illustrates a second embodiment of the etching process for a semiconductor, according to the present invention. This etching process forms part of a method of producing a diaphragm type semiconductor pressure sensor, and more specifically for forming a diaphragm by electrochemical etching under a time control. FIG. 1 shows an etching apparatus for accomplishing the electrochemical etching for the semiconductor, which is similar to that shown in FIG. 1. As shown in FIG. 3, the fabricated structure F is dipped in the etching solution contained in the etching vessel 2. The structure F includes an epitaxial substrate 30 which has a p-type silicon substrate 31 which has a main surface S1 of the plane {100} on which surface a n-type epitaxial layer 32 is formed. The p-type silicon substrate 31 has, for example, a thickness of 500 μMm and a resistivity of 10 Ωcm while the n-type epitaxial layer 32 has, for example, a thickness of 20 μm and a resistivity of 2 Ωcm. Additionally, a silicon oxide film 33 is formed on the surface of the epitaxial layer 32, while a silicon oxide film 34 is formed on the back-side surface or etching-initiation surface S2 of the p-type silicon substrate 31. The silicon oxide film 34 on the etching-initiation surface S2 has been arranged such that a part for covering a region (not to be etched) of the etching-initiation surface S2 is left while the other part for covering the other region (to be etched) of the etching surface S2 is removed, thereby taking the shape as shown in FIG. 3.

A platinum electrode (counter electrode) 35 is dipped in the etching solution 1 and connected to an electric source 36 to serve as a cathode. The n-type epitaxial layer 32 is connected to the electric source 36 to serve as an anode. During the etching in the etching apparatus of FIG. 3, a part of the p-type silicon substrate 31, not covered with the silicon oxide 34 is etched generally in a non-bias condition, which is supposed to be caused by the fact that the p-type silicon substrate 31 is in a condition to be reverse-biased relative to the n-type epitaxial layer 32, in which separation occurs in p-n junction so that current of anodic oxidation does not flow and therefore an anodic oxidation phenomena does not occur. If the part of the p-type silicon substrate 31, not covered with the silicon oxide 34 is sufficiently large as compared with the thickness of the p-type silicon substrate 31, the etching proceeds to reach the n-type epitaxial layer 32, in which a silicon oxide film is formed on the etching surface of the n-type epitaxial layer 32 under the effect of the anodic oxidation thereby terminating the etching when the etching solution 1 comes into contact with the n-type epitaxial layer 32. In such electrochemical etching, the diaphragm having a uniform thickness is ideally supposed to be formed in a high accuracy without carrying out a time control in which the time of etching is controlled, because the thickness of the diaphragm is determined mainly by the thickness of the n-type epitaxial layer 32.

Figure 4A:
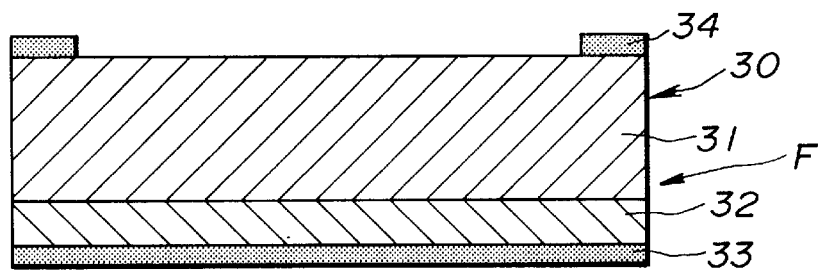
FIG. 4A is a schematic sectional view of a fabricated structure to be etched in the etching apparatus of FIG. 3.

The etching process using the etching apparatus shown in FIG. 3 will be discussed in detail with reference to FIG. 4A to 4C, in which the fabricated structure F as shown in FIG. 3 and 4A is subjected to the etching. The structure F takes shapes shown FIGS. 4B and 4C upon being subjected to the etching under various conditions.

Figure 4B:
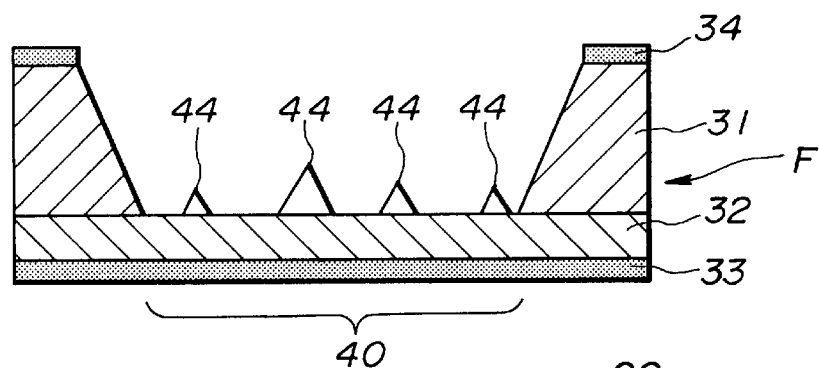
FIG. 4B is a schematic sectional view showing an etching shape of the fabricated structure of FIG. 4A, formed under etching by an etching process using a mixture of hydrazine hydrate and potassium chloride aqueous solution, as the etching solution.

FIG. 4B shows the etching shape of the structure F upon being subjected to the electrochemical etching at the etching temperature (the temperature of the etching solution) of 80° C. using the etching solution 1 which is prepared by adding 1 vol % of saturated (at room temperate) potassium chloride aqueous solution as the supporting electrolyte to hydrazine hydrate thereby to form the diaphragm 40 of the n-type epitaxial layer 32. It will be understood that the supporting electrolyte is added because an electrochemical operation is impossible with only hydrazine hydrate which is high in electric resistance. The etching shape in the course of etching of the n-type silicon substrate 31 is generally similar to the etching shape under non-bias as shown in FIGS. 2B and 2C. During the etching, the etching reaches the n-type epitaxial layer 32 in which the deepest etching portion initially reaches, and then an electrochemical termination of the etching occurs thereby to form the diaphragm 40. In the course of the etching, micro-pyramids 44 (24) repeat their formation and disappearance and becomes in a condition to be left on an etching termination face at which the etching is terminated. The thus left micro-pyramids 44 on the etching termination face cannot be dissolved and removed even if an over-etching is repeatedly made. The diaphragm 40 of such a shape cannot be put into practical use as the diaphragm (having a thickness of several to several tens μm) of the semiconductor pressure sensor. Additionally, as the added amount of the saturated potassium chloride aqueous solution is increased, the electric resistance of the etching solution 1 is lowered; however, there is such a tendency to increase a formation density of the micro-pyramids. In case that the added amount of the saturated potassium chloride aqueous solution is excessively large, side surfaces (of the plane {111}) of the micro-pyramids unavoidably lie one upon another so that the etching bottom surface is constituted of many planes {111}. This finally terminates the etching. In this etching process, a pre-treatment with a hydrofluoric acid system etchant is necessary and has been carried out for the structure F prior to the etching in order to remove the natural oxide film on the structure F, similarly to that in the etching under the non-bias using the etching solution of hydrazine hydrate.

Figure 4C:
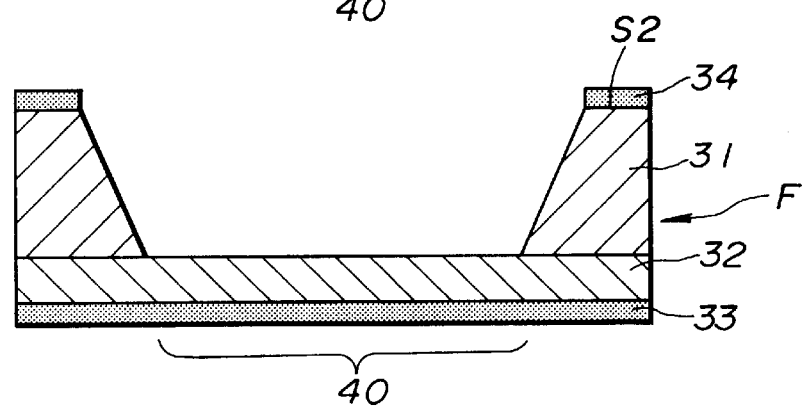
FIG. 4C is a schematic sectional view showing an etching shape of the fabricated structure of FIG. 4A, formed under etching by the etching process according to the present invention.

FIG. 4C shows the etching shape of the structure F upon being subjected to the etching using the etching solution of the present invention. In this case, the etching is carried out, for example, at 80° C. using the etching solution prepared by mixing 5 parts by volume of hydrazine hydrate and 4 parts by volume of 20 wt % KOH aqueous solution, thereby forming the diaphragm 40 of the n-type epitaxial layer 32 and providing the etching shape of FIG. 4C. This etching shape is configured such that not only the micro-pyramid is never formed but also the etching bottom surface (or etching termination face) is formed completely flat and parallel with the etching-initiation surface S2 from which etching is initiated. In this case, a pre-treatment with a hydrofluoric acid system etchant is unnecessary and has not been carried out for the structure F prior to the etching.

Figure 5:
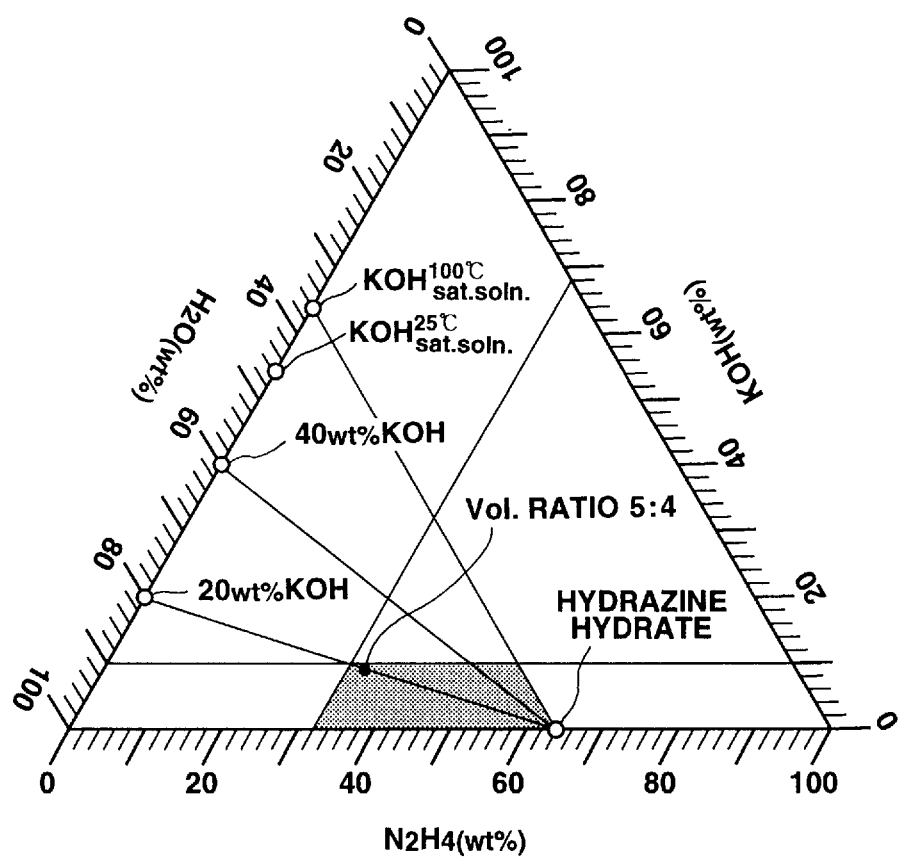
FIG. 5 is a constitutional diagram of a ternary (three component) system of hydrazine ($N_2H_4$)-water ($H_2O$)-potassium hydroxide (KOH), showing advantageous effects of the etching solution of the present invention.

FIG. 5 illustrates results of experiments conducted to exhibit advantageous effects obtained according to the present invention using the etching solution prepared by mixing hydrazine hydrate and potassium hydroxide aqueous solution. Discussion will be made on a constitutional diagram of a ternary (three component) system of hydrazine ($N_2H_4$)-water ($H_2O$)-potassium hydroxide (KOH). In the experiments, the etching process was same as that of the first embodiment and therefore the etching apparatus of FIG. 1 was used.

The diagram of FIG. 5 depicts a preferable composition range of the etching solution of the present invention. As shown in FIG. 5, hydrazine hydrate consists of 64 wt % of hydrazine and 36 wt % of water and therefore is represented at a point (64, 36, 0). A 20 wt % KOH aqueous solution consists of 20 wt % of KOH and 80 wt % of water and therefore is represented at a point (0, 80, 20). A KOH aqueous solution which is readily prepared corresponds to a composition at a point lying on a straight line connecting a point (0, 100, 0) representing an infinitely diluted KOH aqueous solution and a point (0, 46, 54) representing a saturated KOH solution at room temperature or a temperature within a range of from room temperature to about 100° C. A composition at any point lying on a line connecting the point (64, 36, 0) representing hydrazine hydrate and the point (0, 80, 20) representing the 20 wt % KOH aqueous solution can be prepared by mixing hydrazine hydrate and the 20 wt % KOH aqueous solution at a mixing ratio (changeable) of hydrazine hydrate and the 20 wt % KOH aqueous solution. For example, the most frequently used etching solution prepared by mixing hydrazine hydrate and the 20 wt % KOH aqueous solution at a volume ratio of 5:4 is represented at a point (33.3, 57.1, 9.6), in which the specific gravity of hydrazine hydrate is 1.031, and the specific gravity of the 20 wt % KOH aqueous solution is 1.188. Additionally, the composition at any point lying on a line connecting the point (64, 36, 0) representing hydrazine hydrate and the point (0, 60, 40) representing the 40 wt % KOH aqueous solution can be prepared by mixing hydrazine hydrate and the 40 wt % KOH aqueous solution. The etching shape at the point (64, 36, 0) representing hydrazine hydrate is so configured as to have many micro-pyramids as discussed above. However, in case of the etching solution composition containing the 20 wt % KOH aqueous solution so as to exceed the point (63.0, 36.7, 0.3), it is confirmed that no micro-pyramid is formed thereby providing the flat etching bottom surface. Additionally, even in case of the etching solution composition containing the 40 wt % KOH aqueous solution, the same result is obtained revealing that the preferable amount of KOH in the etching solution to prevent formation of micro-pyramid is at least 0.3 wt %. Further, in case of the etching solution composition containing the 20 wt % KOH aqueous solution, the etch rate of the silicon oxide film suddenly increases if the composition exceeds the point (32, 58, 10), so that the etch rate becomes near that in an etching solution consisting of only the 20 wt % KOH aqueous solution.

From the above various experimental results, it has been confirmed that the etching solution which does not allow the micro-pyramid to be developed or formed and suppresses diminution of the silicon oxide film can be obtained by being prepared at the compositions within a range enclosed by a first line connecting a point (64, 36, 0) and a point (0, 36, 64), a second line connecting a point (32, 68, 0) and a point (32, 0, 68), a third line connecting a point (0, 99.7, 0.3) and a point (99.7, 0, 0.3) and a fourth line connecting a point (0, 90, 10) and a point (90, 0, 10), in the constitutional diagram (represented in wt %) of a ternary (three component) system of hydrazine ($N_2H_4$)-water ($H_2O$)-potassium hydroxide (KOH). Additionally, it is confirmed possible to change the crystal surface orientation dependency of etch rate according to the compositions of the etching solution. For example, in case of a production process of a capacitive type semiconductor acceleration sensor in which a weight and a capacitor under the weight are formed, a high degree of crystal surface orientations (particularly, a ratio in etch rate between a plane (311) and a plane {100}) is an important parameter for deciding the weight of the above-mentioned weight and the area of the capacitor, though it is not problematic in the production process of the diaphragm type semiconductor pressure sensor. More specifically, for example, the ratio between the under-etching rate at the plane (311) and the etch rate at the plane {100} is 1.8 in case that the etching is carried out at 80° C. using the etching solution prepared by mixing hydrazine hydrate and the 20 wt % KOH aqueous solution at the mixing volume ratio of 5:4, whereas the same ratio is 1.4 in case of using the etching solution prepared by mixing hydrazine hydrate and the 20 wt % KOH aqueous solution at the mixing volume ratio of 5:1. Accordingly, the final etching shape can be easily changed by altering the composition of the etching solution, even upon using the same mask.

Figure 6:
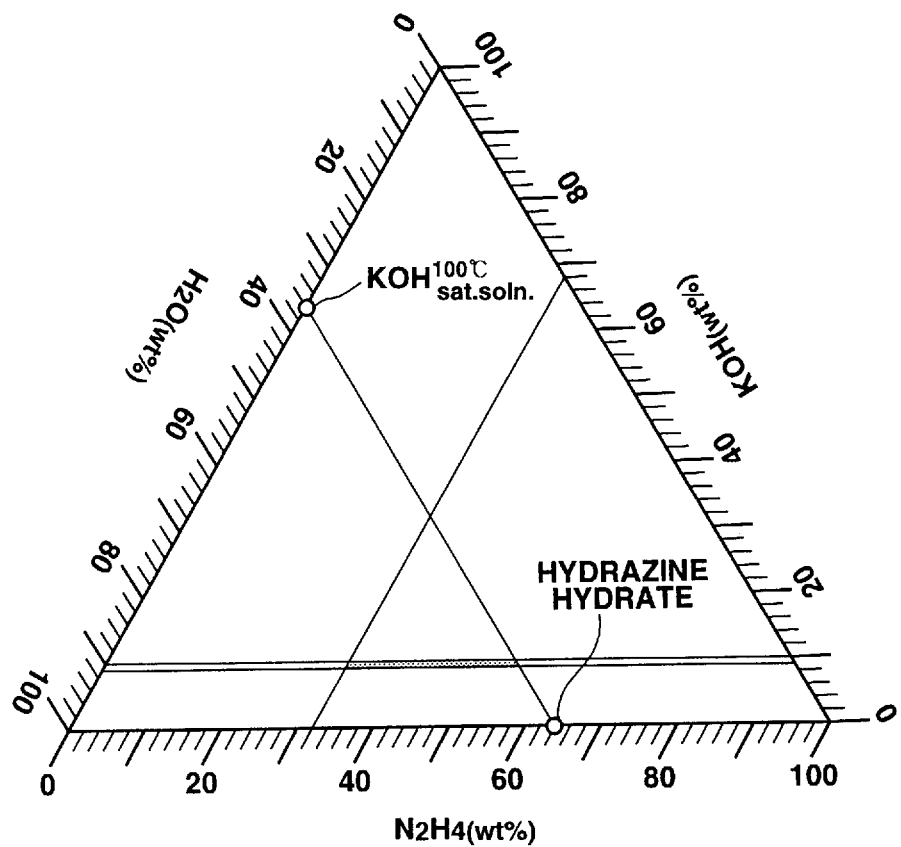
FIG. 6 is a constitutional diagram similar to FIG. 5 but showing further advantageous effects of the etching solution of the present invention.

FIG. 6 illustrates results of experiments conducted upon paying attention on modes of diminution of the silicon oxide film used as the mask. In the experiments, etching was carried out changing the composition of the etching solution as shown in the constitutional diagram of the ternary (three component) system of hydrazine ($N_2HA$)-water ($H_2O$)-potassium hydroxide (KOH). The etching process employed was same as that of the first embodiment and therefore the etching apparatus of FIG. 1 was used.

As shown in FIG. 6, at the point (64, 36, 0) representing hydrazine hydrate, the diminution of the silicon oxide film is nearly none. However, for example, with the etching solution composition containing the 20 wt % KOH aqueous solution, etching is made to the silicon oxide film to some extent. It has been confirmed that the etching to the silicon oxide film proceeds ununiformly until the composition reaches a point (35.4, 8.9, 55.6), while the silicon oxide film continuously diminishes uniformly if the composition exceeds this point. This ununiform etching largely depends not only on the composition of the etching solution but also on flow movement of the etching solution and an etching pattern, so that there are both a case in which etching is made faster at the downstream side in flow of the etching solution, and an opposite case in which etching is made faster at the upstream side, thus exhibiting a complicated etching behavior of the etching solution. Accordingly, it is difficult to decide the minimum thickness of the silicon oxide film, required for the mask.

However, if the etching solution composition is prepared so that the concentration of KOH in the etching solution exceeds a value of 8.9 wt %, uniform diminution of the silicon oxide film can be obtained. As a result, it is easily made possible to decide the minimum thickness of the silicon oxide film, required for the mask, according to an etching selection ratio between the silicon and the silicon oxide film. However, the decision of the minimum thickness of the silicon oxide film has an etching apparatus dependency, and therefore it is preferable to previously measure parameters of the etching apparatus. For example, the etching solution composition consisting of hydrazine hydrate and the 20 wt % KOH aqueous solution at the mixing volume ratio of 5:4 is represented at the point (33.3, 9.6, 57.1), and therefore the KOH concentration exceeds 8.9 wt % in the etching solution so that the silicon oxide film uniformly diminishes. In a certain experimental etching apparatus, the etching selection ratio between the silicon and the silicon oxide film is 1500:1 at 80° C., so that a usual field oxide film or the like having a thickness of about 5000 Å can sufficiently serve as the mask even in case of accomplishing a deep etching in which etching is made nearly throughout the thickness (500 μm) of the silicon substrate.

Figure 7:
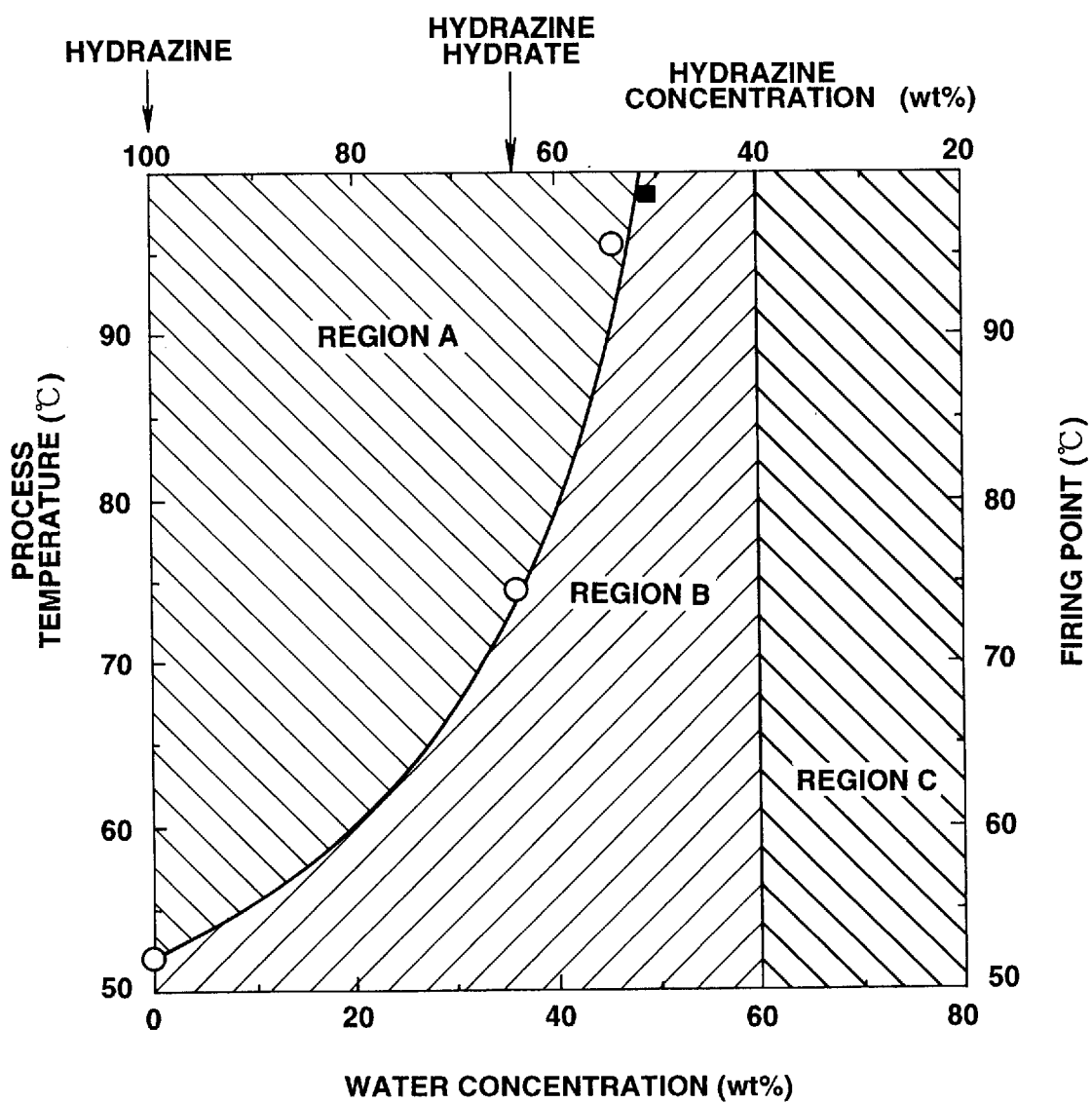
FIG. 7 is a graph showing the fact that the etching solution of the present invention has a high firing point.

FIG. 7 shows the relationship between the composition (in wt %) of hydrazine-water system and the firing point (°C.) in order to illustrate the fact that the etching solution of the present invention is high in firing point. It is to be noted that it is difficult to conduct experiments to measure firing points, and therefore discussion will be made hereinafter using the values of firing points found in usual technical literatures. In FIG. 7, a bright circle indicates a firing point described in "Encyclopedia of Chemical Technology", and a dark square indicates a firing point described in "Tokyo University Aerospace Laboratory Experimental Report". In FIG. 7, the value of 100 wt % in hydrazine concentration represents anhydrous hydrazine (having a zero water content), while the value of 64 wt % in hydrazine concentration represents hydrazine hydrate per se (having a water content of 36%). The firing point abruptly rises as the water concentration increases. If the hydrazine concentration reaches the value lower than 40 wt % (the water concentration higher than 60 wt %), no firing point exists. It will be understood that the hydrazine concentration below which no firing point exists is slightly different in various technical literatures but seems to be almost at the above-mentioned value.

Here, the correlation among the firing point Tf.p (°C.), the hydrazine concentration $CN_2H_4$(wt %) and the water concentration $C_{H2O}$ (wt %) is given by Eq.(1-1).

$$T_{f.P} = 49.1 \cdot \exp\left(0.757 \cdot \frac{C_{H_2O}}{C_{N_2H_4}}\right) \tag{1-1}$$

In case the etching is carried out in a condition (a hatched region A in FIG. 7) to meet Eq.(1-2) in connection with a process temperature $T_{etch}$ (°C.) at which the etching is made, using the etching solution of the hydrazine-water system (containing mainly hydrazine and water), $$T_{etch} > T_{f.P} = 49.1 \cdot \exp\left(0.757 \cdot \frac{C_{H_2O}}{C_{N_2H_4}}\right) \tag{1-2}$$

it is not preferable from the view point of treatment of the etching solution that the process temperature is higher than the firing point of the etching solution.

It is preferable that the process temperature is lower than the firing point of the etching solution in case that Eq.(1-3) is met, $$T_{etch} < T_{f.P} = 49.1 \cdot \exp\left(0.757 \cdot \frac{C_{H_2O}}{C_{N_2H_4}}\right) \tag{1-3}$$

and the etching is carried out in a condition (a hatched region B in FIG. 7) in which the hydrazine concentration is higher than the value of not lower than 40 wt %.

Furthermore, in case that the etching is carried out in a condition (a hatched region C in FIG. 7) in which the hydrazine concentration is not higher than the value of 40 wt %, no firing point exists and therefore the etching condition is preferable.

The etching solution of the present invention is construed to have a composition which is prepared by adding KOH as a third component to the hydrazine-water system. -It is supposed that the third component serves to provide a so-called molar elevation of boiling point thereby lowering the vapor pressure of hydrazine which is only one firing component in the etching solution, thus to raise the firing point of the etching solution. Accordingly, although the etching solution of the present invention is of the ternary system, the firing point largely depends on the ratio between the hydrazine concentration and the water concentration. In this connection, if the etching is carried out to meet the above Eqs.(1) to (3), the etching condition falls actually into a safety side having a margin.

Figure 8:
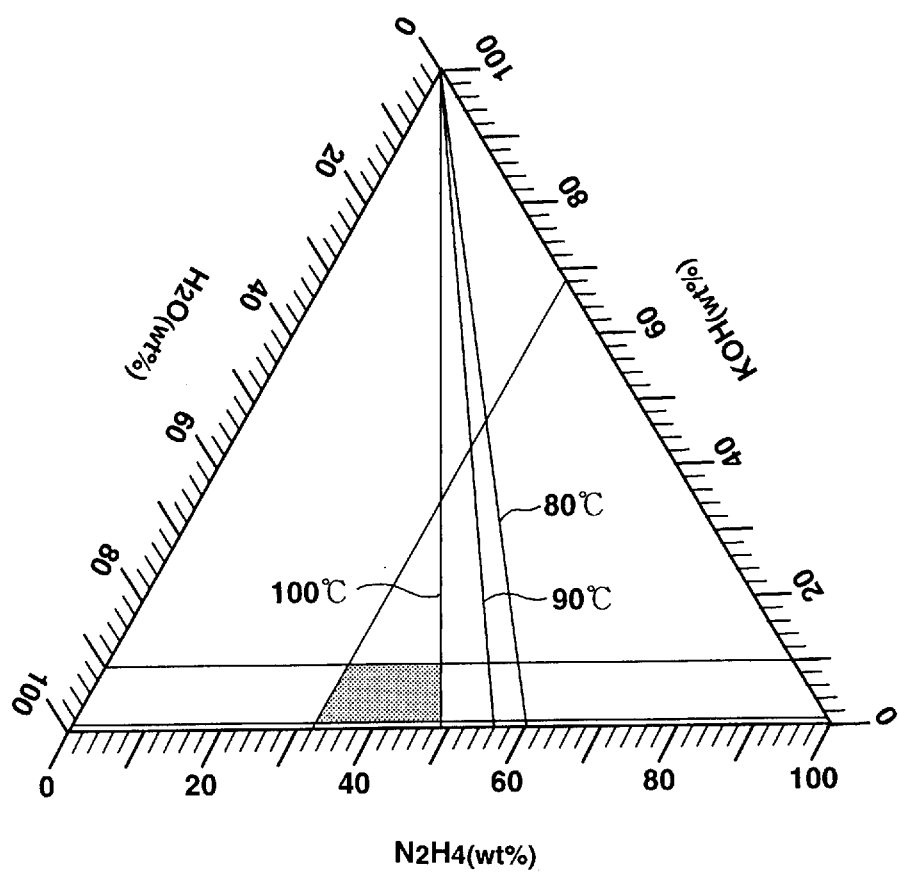
FIG. 8 is a constitutional diagram similar to FIG. 5 but within a region in which the etching solution has a process temperature lower than a firing point.

FIG. 8 shows the constitutional diagram of the ternary system within a region in which the process temperature is lower than the firing point of the etching solution.

Assuming that the process temperature is, for example, 100° C., Eq.(1-4) is obtained from Eq.(1-3).

$$\frac{C_{H_2O}}{C_{N_2H_4}} > 0.939 \tag{1-4}$$

A region of meeting Eq.(1-4) in the constitutional diagram (in wt %) of the ternary system of hydrazine ($N_2H_4$)-water ($H_2O$)-potassium hydroxide (KOH) resides in a range in which the hydrazine concentration is lower than a straight line (indicated by "100° C." in FIG. 8) connecting a first point (48.4, 51.6, 0) and a second point (0, 0, 100). The first point (at which the ratio between hydrazine and water is 0.939) corresponds to a composition which does not contain KOH. The second point corresponds to a composition in which dilution is infinitely made with KOH as the third component. In such a region of meeting Eq.(1-4), an excellent etching characteristics can be obtained in which no micro-pyramid is developed while diminution of the silicon oxide film is little. A shaded range in FIG. 8 is within the above region and has the process temperature lower than the firing point. Similarly, assuming that the process temperatures are, for example, 90° C. and 80° C., Eqs. (1-5) and (1-6) are obtained from Eq.(1-3). The borders in the cases of the process temperatures of 90° C. and 80° C. correspond respectively to straight lines which are indicated by "90° C." and "80° C." in FIG. 8.

$$\frac{C_{H_2O}}{C_{N_2H_4}} > 0.800 \tag{1-5}$$

$$\frac{C_{H_2O}}{C_{N_2H_4}} > 0.644 \tag{1-6}$$

Figure 9:
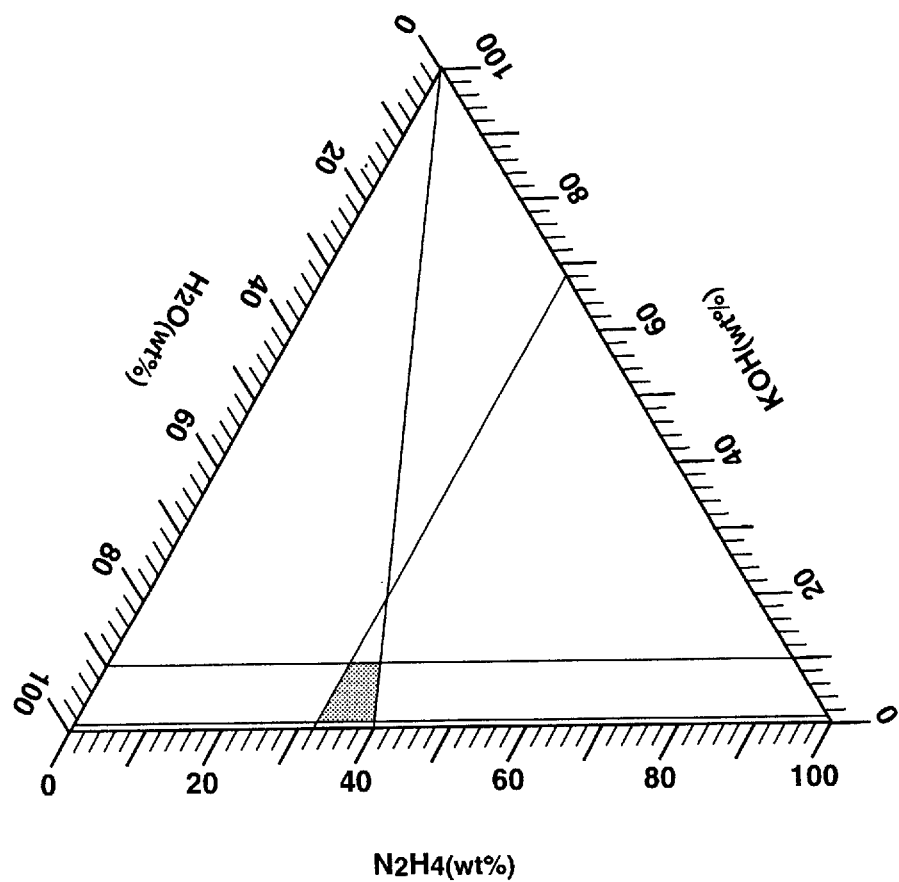
FIG. 9 is a constitutional diagram similar to FIG. 5 but within a region in which the etching solution has no firing point.

FIG. 9 shows a constitutional diagram of the ternary system within a region in which no firing point exists, in which the firing point is assumed to be infinitely diverged, so that the diagram of FIG. 9 is supposed to be contained in the diagram of FIG. 8 from the view point of a set theory. It is sufficient that the weight ratio between hydrazine hydrate and water meets Eq.(1-7) and therefore a region of meeting Eq.(1-7) is given in a range in which the hydrazine concentration is lower than a straight line connecting a point (40, 60, 0) and a point (0, 0, 100).

$$\frac{C_{H_2O}}{C_{N_2H_4}} > 0.4 \tag{1-7}$$

While discussion has been made on the cases in which the potassium hydroxide aqueous solution is added to hydrazine hydrate, it will be appreciated that the potassium hydroxide may be replaced with other metal hydroxide (MOH), which will exhibit the same effects. Although the above-discussed electrochemical etching processes have been shown and described as of the dual-pole manner (using a working electrode or the silicon substrate, and a counter electrode or the platinum electrode), it will be understood that the principle of the present invention may be applied to other electrochemical etching processes of the triple-pole manner (using three electrodes) or of the quadruple-pole manner (using four electrodes). In case of the triple-pole manner, a standard electrode such as a Ag/AgCl standard electrode may be used in the etching apparatus of FIG. 3 in which the n-type epitaxial layer 32 serves as the working electrode while the platinum electrode 35 serves as the counter electrode, the electrodes being connected to a potentiostat (not shown) as the electric source so as to control the electric potential of the working electrode at a value at which anodic oxidation of the n-type epitaxial layer 32 occurs. While only the two-layer silicon substrate having the main surface (substrate or crystal surface orientation) of the plane {100} has been shown and described as being used as an object to be etched, it will be appreciated that the substrate surface orientation of the object to be etched may be other than the plane {100} while the object to be etched may be of the single layer type, or of the three-layer type. Additionally, the characteristics and thickness of the p-type and n-type conductivity layers may not be limited to those described above. Although the reverse bias in impressed voltage has been described as being applied between the p- and n-type conductivity layers, it will be understood that normal bias may be applied to the p- and n-type conductivity layers.

Although the diaphragm type semiconductor pressure sensor has been shown and described as a product to be produced upon carrying out the etching process of the present invention, the principle of the present invention may be applied to production of other semiconductor sensors such as a semiconductor acceleration sensor and an infrared ray sensor, and other semiconductor function devices. While the etching solution has been shown and described as being prepared by using hydrazine hydrate as the main component, it will be understood that the etching solution may be prepared by adding a potassium hydroxide aqueous solution to anhydrous hydrazine, or otherwise by adding water and potassium hydroxide to hydrazine per se, in which it is will be readily understandable by a person skilled in the art that the etching characteristics of the etching solution prepared by different methods are the same if the composition of the ternary system of hydrazine ($N_2H_4$)-water ($H_2O$)-potassium hydroxide (KOH) is the same, and therefore does not depend on the preparation methods.

Figures 10A, 10B, 10C:
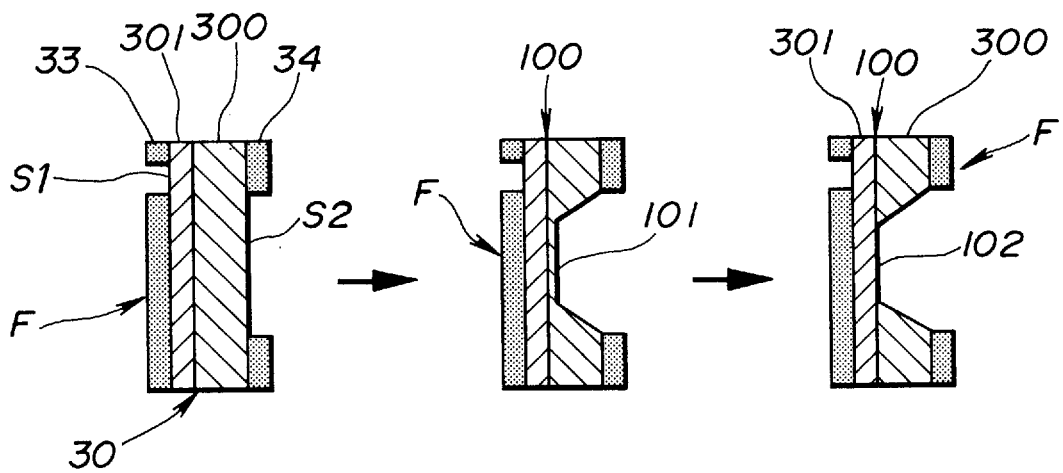
FIG. 10A is a schematic sectional view of a fabricated structure to be etched in a third embodiment of the etching process according to the present invention.
FIG. 10B is a schematic sectional view similar to FIG. 10A but showing an etching shape of the fabricated structure of FIG. 10A, formed in a pre-etching step of the etching process of the present invention.
FIG. 10C is a schematic sectional view similar to FIG. 10B but showing another etching shape of the fabricated structure of FIG. 10A, formed in a final etching step of the etching process of the present invention.
Figure 11:
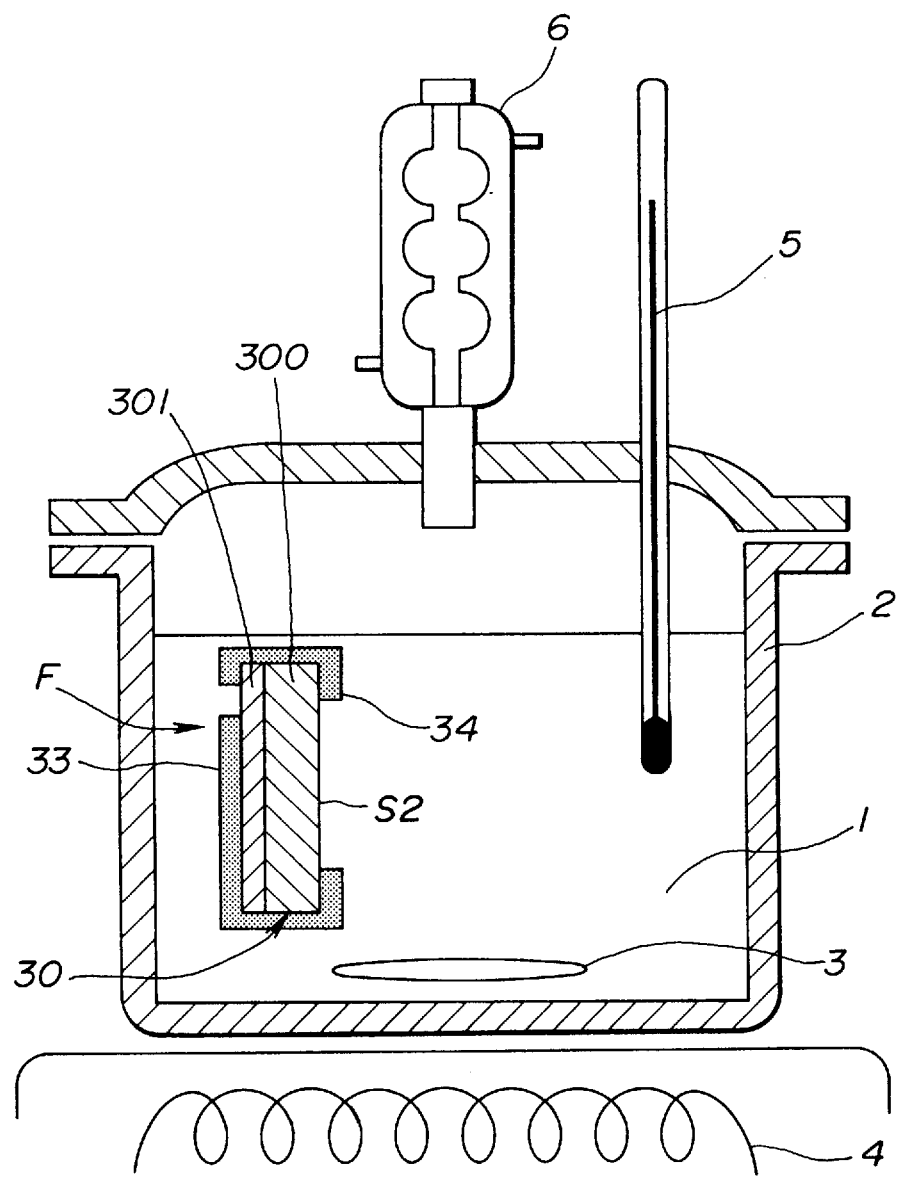
FIG. 11 is a schematic illustration of an etching apparatus for carrying out the pre-etching step of FIG. 10B.

FIGS. 10A to 10C illustrate a third embodiment of the etching process for a semiconductor, according to the present invention. This etching process is similar to that discussed on the first embodiment etching process as discussed in connection with FIG. 1, and forms part of a method of producing a diaphragm type semiconductor pressure sensor. FIG. 11 shows an etching apparatus for accomplishing the electrochemical etching for the semiconductor, which is similar to that shown in FIG. 1.

First, a fabricated structure F as shown in FIG. 11 is prepared to include an epitaxial substrate 30. The epitaxial substrate 30 includes a p-type silicon substrate 300 which has a main surface of the plane {100} on which a n-type epitaxial layer 301 is formed. The p-type silicon substrate 300 has, for example, a thickness of 600 $\mu$m and a resistivity of 10 $\Omega$cm while the n-type epitaxial layer 301 has, for example, a thickness of 10 $\mu$m and a resistivity of 2 $\Omega$cm. Additionally, a silicon oxide film 33 is formed on the surface of the epitaxial layer 32, while a silicon oxide film 34 is formed on the back-side surface or etching-initiation surface S2 of the p-type silicon substrate 31. The silicon oxide film 34 on the etching-initiation surface S2 has been configured such that a part for covering a region (not to be etched) of the etching-initiation surface S2 is left while the other part for covering the other region (to be etched) of the etching surface S2 is removed, thereby taking the shape as shown in FIG. 10A.

Subsequently, the structure F is dipped in the etching solution 1 at 80° C. in the etching apparatus of FIG. 11 and etched under non-bias, in which the etching is made deeply such that the etching bottom surface 101 reaches to the vicinity of the interface of the p-n junction 100 so that the depth of a depression formed by the etching is, for example, 580 $\mu$m, as shown in FIG. 10B. The etching solution in this case is hydrazine hydrate. This etching is referred to as a "pre-etching" step. In this pre-etching step, only the back-side surface S2 of the epitaxial substrate 30 is etched, and therefore a main surface S1 of the epitaxial substrate 30 may be covered with a SiN film or a resin film to protect it from the etching solution, or covered with a part of a jig (not shown) to prevent the main surface S1 from contacting with the etching solution upon disposing the epitaxial substrate 30 in the jig.

Next, the structure F shown in FIG. 10B is dipped in the etching solution 1 shown in FIG. 3 to be subjected to an electrochemical etching using the etching solution 1 prepared by adding a saturated KCl aqueous solution (as a supporting electrolyte) to hydrazine hydrate. The etching is carried out at 80° C. in etching solution temperature, in which the etching is electrochemically terminated so that the etching bottom surface 102 reaches to the interface of the p-n junction 100.

Advantageous effects of the third embodiment etching process according to the present invention will be discussed in comparison with effects of a conventional etching process.

First, in the conventional etching process in which the structure F shown in FIG. 10A is processed immediately from that shown in FIG. 10A to that shown in FIG. 10C, a time $T_{ECE,con}$ (min.) for which the electrochemical etching apparatus as shown in FIG. 3 is exclusively used is given by Eq. (2-1) using a thickness $D_{pn}$ ($\mu$m) of the epitaxial substrate 30 (the thickness corresponds to the dimension of from the surface S2 to the interface of the p-n junction 100) and an etch rate $v_{ECE}$ ($\mu$m/min) at the etching-initiation surface S2 in the electrochemical etching.

$$T_{ECE,con} = \frac{D_{pn}}{V_{ECE}} \quad (2\text{-}1)$$

For example, in case that the electrochemical etching is carried out under a condition in which the thickness of the p-type silicon substrate 31 is 600 $\mu$m; the etching solution is prepared by adding the saturated KCl aqueous solution (as the supporting electrolyte) to hydrazine hydrate; and the temperature of the etching solution is 80° C. In this electrochemical etching, the etch rate is highly dependent on the electrochemical etching apparatus, in which the etch rate in the used etching apparatus is 1.7 $\mu$m/min. The time required for the electrochemical etching is about 350 min. It is to be noted that the high cost electrochemical etching apparatus is occupied for about 6 hours to complete the etching of each wafer or the structure F, taking account of a time required for over-etching and a time required for setting the wafer in position.

In contrast, in the third embodiment etching process of the present invention, the time $T_{ECE,imp}$ (min) for which the electrochemical etching apparatus as shown in FIG. 3 is exclusively used in the final (electrochemical) etching step is given by Eq. (2-2) using a depth $D_{pri}$ (μm) of the pre-etching (corresponding to the depth of a depression formed by the electrochemical etching).

$$T_{ECE,imp} = \frac{D_{pn} - D_{pri}}{V_{ECE}} \qquad (2\text{-}2)$$

As will be apparent from Eq. (2-2), the exclusively used time $T_{ECE,imp}$ linearly decreases as the depth of the pre-etching is larger. For example, in case of having carried out the pre-etching of 580 mm on the p-type silicon substrate 31 having a thickness of 600 μm, the exclusively used time $T_{ECE,imp}$ of the electrochemical etching apparatus is only about 12 min. Accordingly, the high cost electrochemical etching apparatus is occupied only for a time shorter than 30 minutes to complete the etching of each wafer or the structure F, even taking account of a time required for over-etching and a time required for setting the wafer in position. By the way, a time $T_{pri}$ (min) for which the etching apparatus shown in FIG. 11 is exclusively used to accomplish the pre-etching step is given by Eq. (2-3) using an etch rate $V_{pri}$ (μm/min) at the etching-initiation surface S2 in the pre-etching.

$$T_{pri} = \frac{D_{pri}}{V_{pri}} \qquad (2\text{-}3)$$

In this case, the exclusively used time $T_{pri}$ is about 340 min. However, the pre-etching can be accomplished by a standard wet etching apparatus and therefore never exclusively uses the high cost electrochemical etching apparatus, thereby extremely shortening the exclusively used time $T_{ECE,imp}$ for the electrochemical etching apparatus as shown in FIG. 3. This largely lowers a production cost for a devices, including a plant and equipment investment cost for a micro-machining process.

Additionally, shortening the exclusively used time for the electrochemical etching process leads to lowering a risk of accident in case that the etching solution or a reaction product in the electrochemical etching is inflammable or explosive. In this connection, in fact, the present inventors have experienced that a platinum electrode is broken upon ignition of hydrogen gas generated, during a conventional long electrochemical etching using hydrazine hydrate as the etching solution.

Furthermore, the excessively shortened exclusively used time for the electrochemical etching apparatus causes the amount of silicon dissolved in the etching solution to be excessively minimized thereby retarding deterioration of the etching solution and making possible it to etching-treat many silicon substrates. For example, assume the case of producing a pressure sensor (as shown in FIG. 10C) having an opening whose each side has a dimension $L_{mask}$, and having the p-type silicon substrate (300) whose thickness (from the surface S2 to the p-n junction interface) is $D_{pn}$. Here, each side of the diaphragm of the pressure sensor has a dimension $L_{dia}$ which is given by Eq. (2-4). In the structure F shown in FIG. 10C, the n-type epitaxial layer 301 serves as the diaphragm of the pressure sensor.

$$L_{dia} = L_{mask} - \sqrt{2} \; D_{pn} \qquad (2\text{-}4)$$

In the conventional electrochemical etching process, the volume $V_{con}$ of silicon to be dissolved in the etching solution is given by Eq. (2-5).

$$V_{con} = \frac{L_{mask}^3}{3\sqrt{2}} - \frac{1}{3} \left(L_{mask} - \sqrt{2} \; D_{pn}\right)^2 \left(\frac{L_{mask}}{\sqrt{2}} - D_{pn}\right) \qquad (2\text{-}5)$$

In contrast, in the etching process of the present invention, assuming that the pre-etching of the depth $D_{pri}$ is carried out, the volume Vpri of silicon to be dissolved in the etching solution in the pre-etching step is given by Eq. (2-6) using the etch rate $v_{pri}$ (μm/min) in the pre-etching.

$$V_{pri} = \frac{L_{mask}^3}{3\sqrt{2}} - \frac{1}{3} \left(L_{mask} - \sqrt{2} \; D_{pri}\right)^2 \left(\frac{L_{mask}}{\sqrt{2}} - D_{pri}\right) \qquad (2\text{-}6)$$

Accordingly, the volume $V_{fin}$ of silicon to be dissolved in the etching solution in the final or electrochemical etching step of this embodiment is given by Eq. (2-7) which corresponds to the difference between Eq. (2-5) and Eq. (2-6).

$$V_{fin} = V_{con} - V_{pri} \qquad (2\text{-}7)$$

Figure 12:
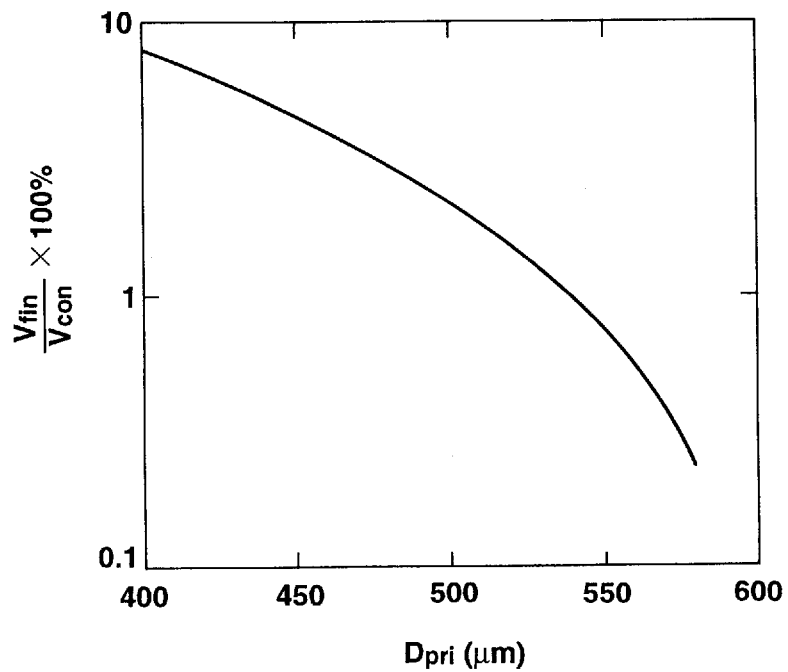
FIG. 12 is a graph showing the ratio (%) of $V_{fin}/V_{con}$ as a function of $D_{pri}$ on the assumption that the thickness of a p-type silicon substrate is 600 $\mu$m.

FIG. 12 is a graph showing the rate (%) of $V_{con}$ to $V_{fin}$ as the function of $D_{pri}$ in a condition where the thickness of the p-type silicon substrate (300) is 600 μm. As seen in FIG. 12, if the pre-etching is made by 400 μm which corresponds to ⅔ of the thickness of the p-type silicon substrate, the volume of silicon to be dissolved in the etching solution in the final etching step is about ¹⁄₁₀ of that in the conventional electrochemical etching. Similarly, if the pre-etching is made by 500μm, the volume of silicon to be dissolved is about ¹⁄₁₀₀ of that in the conventional electrochemical etching. As a result, life of the electrochemical etching solution in the etching process of this embodiment reaches about 10 to 100 times of that in the conventional electrochemical etching.

In case of using the electrochemical etching solution prepared by adding the saturated KCl aqueous solution as the supporting electrolyte to hydrazine hydrate, the etching solution is deteriorated only upon the etching-treatment of two silicon substrates in the conventional electrochemical etching consisting of a single electrochemical etching step, so that the etching solution has not been able to be used owing to formation of a roughened etching surface and lowering in etch rate uniformity throughout the etching surface. According to the etching process of the third embodiment of the present invention, in the same case, the specifications or requirements such as formation of the roughened etching surface and the etch rate uniformity lowering can be moderated in the pre-etching step in which a major part of the wafer or silicon substrate is etched, and therefore the etching-treatment amount of the silicon substrate per unit volume of the etching solution can be increased. Additionally, the etching solution which has been already used in the final or electrochemical etching step can be used in the pre-etching step. This further lowers a production cost including chemicals consumption cost in the micro-machining process, for a semiconductor device.

In the etching process of the third embodiment of the present invention, the pre-etching can be made at a high etch rate to complete the pre-etching within a short period of time, for example, by raising the etching temperature to a high level. This shortens the time required in the micro-machining process, thereby further lowering the production cost.

In this connection, for example, the etch rate $v_{\{100\}}$ (μm/min) at the plane {100} of the silicon substrate in the etching using hydrazine hydrate as the etching solution has the apparatus dependency and given by Eq. (2-8) using the temperature T of the etching solution. The Eq. (2-8) is an experimental formula for the experimental etching apparatus used by the present inventors in the pre-etching step.

$$V_{(100)} = 1.147 \times 10^5 \cdot \exp\left(-\frac{4.03 \times 10^3}{T}\right) \tag{2-8}$$

At this time, the apparent activation energy of etching reaction is 7.97 kcal/mol. Accordingly, by raising the etching temperature by about 20° C., about two times in etch rate can be obtained, thereby shortening the time required for the etching, to about half of that obtained before raising the etching temperature.

In case of using a potassium hydroxide aqueous solution as the etching solution, the apparent activation energy of the etching reaction is as high as 13.7 kcal/mol as discussed by Kishi et al in "Suppression Method for Micro-pyramid in Anisotropic Etching of Si", Vacuum, the 29th volume, the second number, pages 85 to 91 (1986). Thus, it will be understood that the temperature largely affects the etch rate.

Examples of important parameters for determining the etch rate are flowing movement and concentration of the etching solution in addition to the temperature. Such a parameter dependency of the etching solution are different according to the etching solution system (the main component of the etching solution), in which some etching solution system has a high apparatus dependency. Thus, a variety of measures can be taken to obtain a high etch rate in the pre-etching step of the etching process of the third embodiment of the present invention.

In order to increase the etch rate, other chemical components may be added to the etching solution, in which examples of the chemical components are catalysts for etching reaction, quenching agents or negative catalyst for etching reaction, inhibitors for specific absorption and the like which are to be selectively used corresponding to the etching solution system or the like.

In general, under the etching at a high etch rate, etching characteristics such as roughness, undulation and uniformity of the etching surface are degraded, as a result of the increased etch rate. This tendency is similar in deterioration of the etching solution. Under such a condition, the high etch rate can be used if the moderate specifications in the pre-etching can be met, in which the degree of the moderating depends on a semiconductor device to be produced. For example, in case of a production process of the semiconductor pressure sensor, the etching shape is generally of a frustum of a pyramid in which each side surface is of the plane {111}, the top surface corresponds to the interface of the p-n junction, and the base surface corresponds to the opening of the mask at the back-side surface S2 of the silicon substrate as shown in FIGS. 10A to 10C. Such an etching shape can be sufficiently obtained by the pre-etching. In case of a production process of a semiconductor acceleration sensor, a part (serving as a weight) to be left unetched in the etched depression of the above etching shape of a frustum of a pyramid, and therefore the ununiformity of the etching surface affects the weight of the finally formed weight so as to provide an ununiformity in sensor sensitivity, though the roughness and undulation of the etching surface may be ignored. Accordingly, the specifications of the uniformity of the etching surface may not be largely moderated.

As discussed above, it is preferable that in the third embodiment etching process, that the etching solutions to be used respectively in the pre-etching and final etching steps are different in characteristics which is, for example, chemical composition, or process conditions such as temperature, concentration and flowing condition in case of using the same etching solution. Additionally, in case of carrying out the final etching using an etching solution which has not yet deteriorated while an already used etching solution is used for the pre-etching. The above largely lowers production cost for a semiconductor device, including a plant and equipment investment cost for a micro-machining process, cost for raw materials to be consumed such as various chemicals to be used, and labor cost.

Next, discussion will be made on cases in which a so-called batch etching-processing is carried out in which a plurality of wafers or silicon substrates are simultaneously etched in the pre-etching step to accomplish the etching of a major part of the wafer.

First, a plurality of the fabricated structures F as shown in FIG. 10A are prepared and set on a wafer cassette (not shown), and thereafter dipped in the etching solution 1 at 80° C. in the etching apparatus of FIG. 11, so that the structures F are etched under non-bias. In this pre-etching, the etching is made deeply such that the etching bottom surface 101 reaches to the vicinity of the interface of the p-n junction 100 so that the depth of a depression formed by the etching is, for example, 580 μm, as shown in FIG. 10B. The etching solution in this case is hydrazine hydrate. Subsequently, the structures F shown in FIG. 10B are dipped in the etching solution 1 in the etching apparatus as shown in FIG. 3 to be subjected to an electrochemical etching using the etching solution 1 prepared by adding a saturated KCl aqueous solution (as the supporting electrolyte) to hydrazine hydrate. The etching is carried out at 80° C. in etching solution temperature, in which the etching is electrochemically terminated so that the etching bottom surface 102 reaches to the interface of the p-n junction 100. This is the final etching step.

Concerning a throughput made in each etching process, in the conventional electrochemical etching process carried out in a condition in which, for example, the p-type silicon substrate (300) has a thickness of 500 μm, the n-type epitaxial layer (301) has a thickness of 10 μm, the electrochemical etching solution is prepared by adding the saturated KCl aqueous solution as the supporting electrolyte to hydrazine hydrate, and the etching operation temperature is 80° C., the time required for the etching is above 294 min so that an etching-treatment time for each wafer or silicon substrate reaches about 5 hours.

In contrast, according to the third embodiment etching process of the present invention, the etching-treatment time $T_{wafer}$ (min) for each wafer or silicon substrate is given by Eq. (2-9) on the assumption that the number of the wafers to be simultaneously treated in the pre-etching step is $W_{pri}$, and the etch rate in the final etching step is $v_{fin}$ (μm/min).

$$T_{wafer} = \frac{D_{pri}}{v_{pri} \cdot W_{pri}} + \frac{D_{pn} - D_{pri}}{v_{fin}} \tag{2-9}$$

Figure 13:
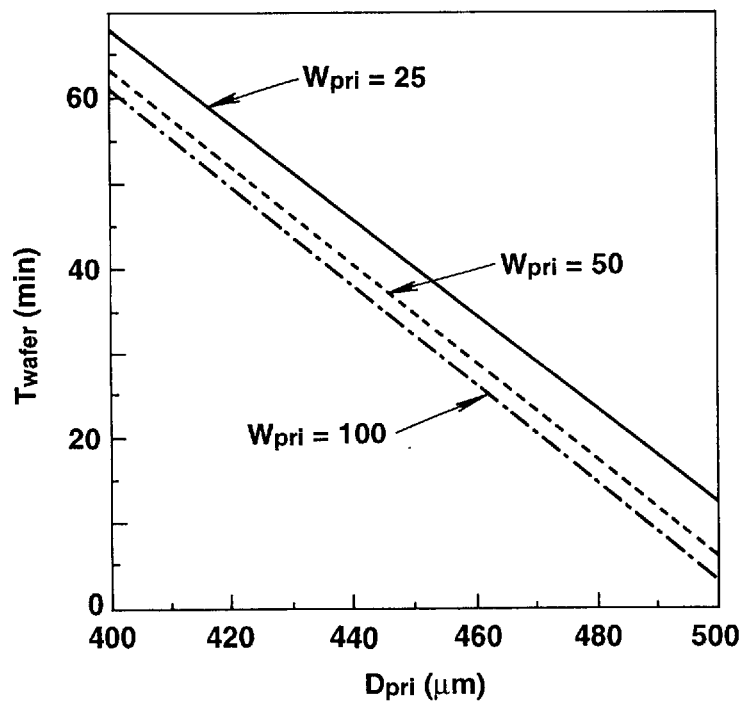
FIG. 13 is a graph showing the dependency of $T_{wafer}$ on $D_{pri}$.
Figure 14:
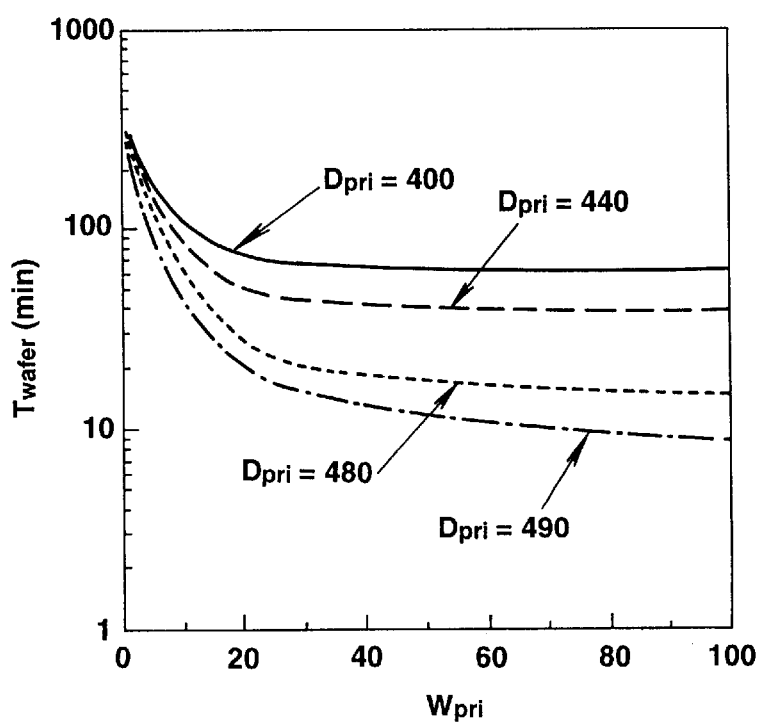
FIG. 14 is a graph showing the dependency of $T_{wafer}$ on $W_{pri}$.

In case of carrying out the pre-etching step at the operation temperature of 80° C. using hydrazine hydrate as the etching solution under the batch etching-processing, the $D_{pri}$ dependency of $T_{wafer}$ and the $W_{pri}$ dependency of $T_{wafer}$ are shown respectively in FIGS. 13 and 14 under a condition that the etch rate is 1.7 μm/min though it largely depends on the etching apparatus. FIGS. 13 and 14 demonstrate that $T_{wafer}$ linearly decreases as $D_{pri}$ increases while decreases like an exponential function as $W_{pri}$ increases.

Furthermore, the batch etching-processing may be employed even in the final etching step so as to simultaneously etching-treating a plurality of the wafers. In this case, in Eq. (2-9), the value of the first term is larger than the value of the second term in the right side of the equation; the value of the first term is as large as about 30 times of the value of the second term in the above-described instance. As a result, the advantageous effects according to this case are not so large as compared with the case in which a plurality of the wafers are simultaneously subjected to the pre-etching in the pre-etching step.

Practically, it is impossible to cause $D_{pri}$ to infinitely approach to $D_{pn}$ from the view point of obtaining uniformity of etching at the surface of the wafer or silicon substrate. According to the inventors' experiments using the etching apparatus shown in FIG. 11 for the pre-etching, the uniformity of etching is not higher than ±1%, and therefore it is no problem to make such an etching as to leave unetched a part having a thickness of about 20 μm, so that 25 wafers set in the standard cassette can be simultaneously etching-treated as a single batch. In this case, it will be understood from Eq. (2-9), that the etching-treatment time required for each wafer is less than 25 minutes. In comparison of the third embodiment etching process of the present invention with the conventional electrochemical etching process purely in terms of time required for etching, the throughput in the etching process of the present invention is improved as high as more than 10 times of that in the conventional electrochemical etching process. From the practical view point, a time required for over-etching and a time required for setting the wafers to the etching apparatus are necessary; however, these times are short. Furthermore, the present inventors have devices an electrochemical etching system or process in which attaching and detaching the wafers can be quickly accomplished with one-touch, though not shown. With this system, the time required for setting the wafers to the etching apparatus can be nearly negligible. This electrochemical etching system is arranged as follows: The wafers are mounted on a particular jig and therefore attached to and detached from an electrochemical etching apparatus under the action of the jig. This excessively shortens the time required for setting the wafers in the apparatus while largely reducing labor for attaching and detaching the wafers. Additionally, this improves the repeatability of the setting position of the wafers thereby improving the reproducibility of etching.

According to the third embodiment etching process of the present invention, the non-bias etching at the first stage and the electrochemical etching at the second stage can be simultaneously respectively for separate wafers thereby to contribute to an improvement in throughput of products or semiconductor devices. Assuming that two electrochemical etching apparatuses are simultaneously operated in the conventional electrochemical etching process carrying out only the electrochemical etching, the throughput in the conventional electrochemical etching process does not reach a level of the above etching process of the present invention in which one non-bias etching apparatus (as shown in FIG. 11) for the first stage and one electrochemical etching apparatus (as shown in FIG. 3) for the second stage are simultaneously operated. In case that a plant and equipment investment is required to increase the production amount of semiconductor devices, it is sufficient to add only one electrochemical etching apparatus upon increasing non-bias etching apparatuses which are inexpensive and low in operational cost. Thus, according to the third embodiment etching process of the present invention, the number of the expensive electrochemical etching apparatuses can be extremely reduced thereby largely lowering the plant and equipment investment cost.

Figure 15A:
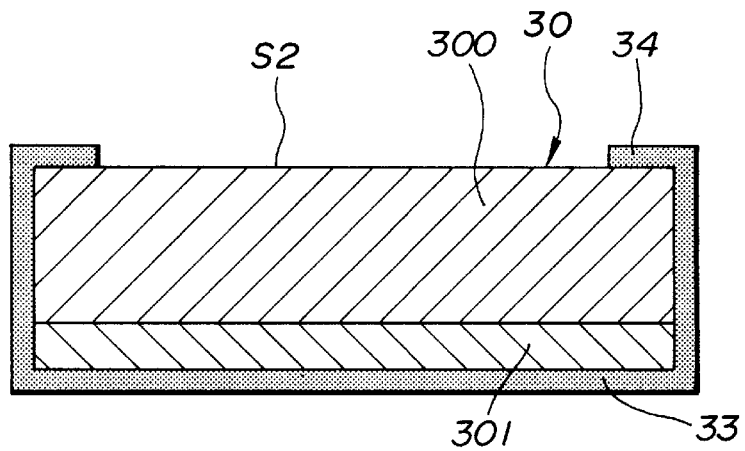
FIG. 15A is a schematic sectional view of a fabricated structure to be etched in a fourth embodiment of the etching process according to the present invention.
Figure 15B:
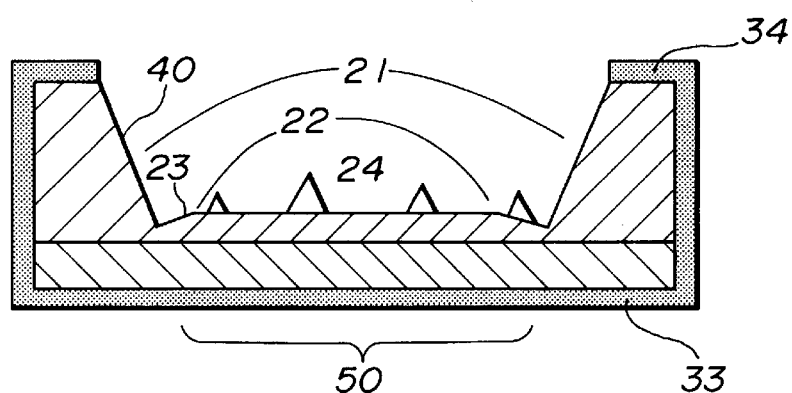
FIG. 15B is a schematic sectional view similar to FIG. 15A but showing an etching shape of the fabricated structure of FIG. 15A, formed in the pre-etching step of the etching process of the present invention.
Figure 15C:
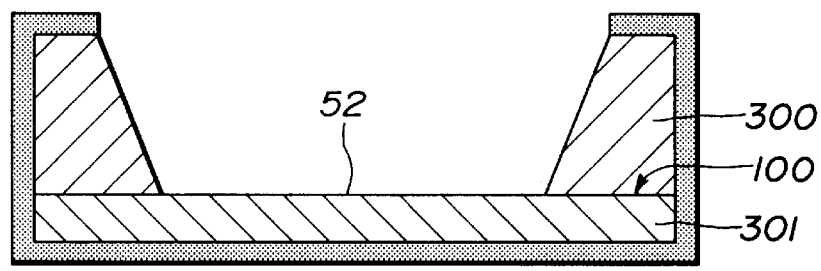
FIG. 15C is a schematic sectional view similar to FIG. 15B but showing another etching shape of the fabricated structure of FIG. 15A, formed in the final etching step of the etching process of the present invention.

FIGS. 15A to 15C illustrate a fourth embodiment of the etching process of the present invention, which is similar to the third embodiment etching process mainly with the exception that the final or electrochemical etching is carried out using the electrochemical etching solution prepared by adding an aqueous solution of a metal hydroxide such as potassium hydroxide to hydrazine hydrate.

First, the fabricated structure F as shown in FIG. 15A is prepared including an epitaxial substrate 30. The epitaxial substrate 30 includes the p-type silicon substrate 300 which has the main surface on which the n-type epitaxial layer 301 is formed. The silicon oxide film 33 is formed on the surface of the epitaxial layer 32, while the silicon oxide film 34 is formed on the back-side surface or etching-initiation surface S2 of the p-type silicon substrate 31. Additionally, a silicon oxide film (not identified) is formed to cover the side surface of the epitaxial substrate 30 and formed integral with the silicon oxide films 33, 34.

The structure F is dipped in the etching solution (hydrazine hydrate) 1 in the etching apparatus of FIG. 11 and etched under non-bias, in which the etching is made deeply such that the etching bottom surface 21 reaches to the vicinity of the interface of the p-n junction or between the p-type silicon substrate 300 and n-type epitaxial layer 301, as shown in FIG. 15B. In FIG. 15B, the etched structure F has an etching depression (not identified) which is defined by the etching side wall 40 of the plane {111} which is characteristic in an alkali anisotropic etching, and the etching bottom surface 21. The etching bottom surface 21 includes the flat surface 22 of the plane {100}, and the gently sloping surface 23 of the plane {111} which surface is continuous to the etching side surface 40. Many micro-pyramids 24 are formed on the etching bottom surface 21.

Subsequently, the structure F shown in FIG. 15B is dipped in the etching solution 1 shown in FIG. 3 to be subjected to the final or electrochemical etching using the etching solution 1 prepared by mixing hydrazine hydrate and the 20 wt % KOH aqueous solution in a volume ratio of 5:4. The etching is carried out at 80° C. in etching solution temperature, in which the etching is electrochemically terminated so that the etching bottom surface 21 reaches to the interface of the p-n junction 100. At this final etching step, the micro-pyramids 24 are disappeared thereby to form the flat etching stopping surface 52 at which the etching is stopped as shown in FIG. 15C. As a result, a highly precise diaphragm of the n-type epitaxial layer 301 is formed. With the above etching solution, an oxide film such as a natural oxide film can be dissolved and removed, and therefore no pre-treatment for removing the natural oxide film is necessary.

In the fourth embodiment etching process of the present invention, the etching solution having such a high firing point as to prevent its firing during etching or no firing point is used in the final or electrochemical etching step. Although hydrazine hydrate is used in the pre-etching step, the pre-etching is carried out under non-bias. Accordingly, this etching process is safer than the conventional electrochemical etching process in which etching is completed by only single electrochemical etching.

Next, discussion will be made on a mechanism by which micro-pyramids disappear, studied by the present inventors.

Figure 16:
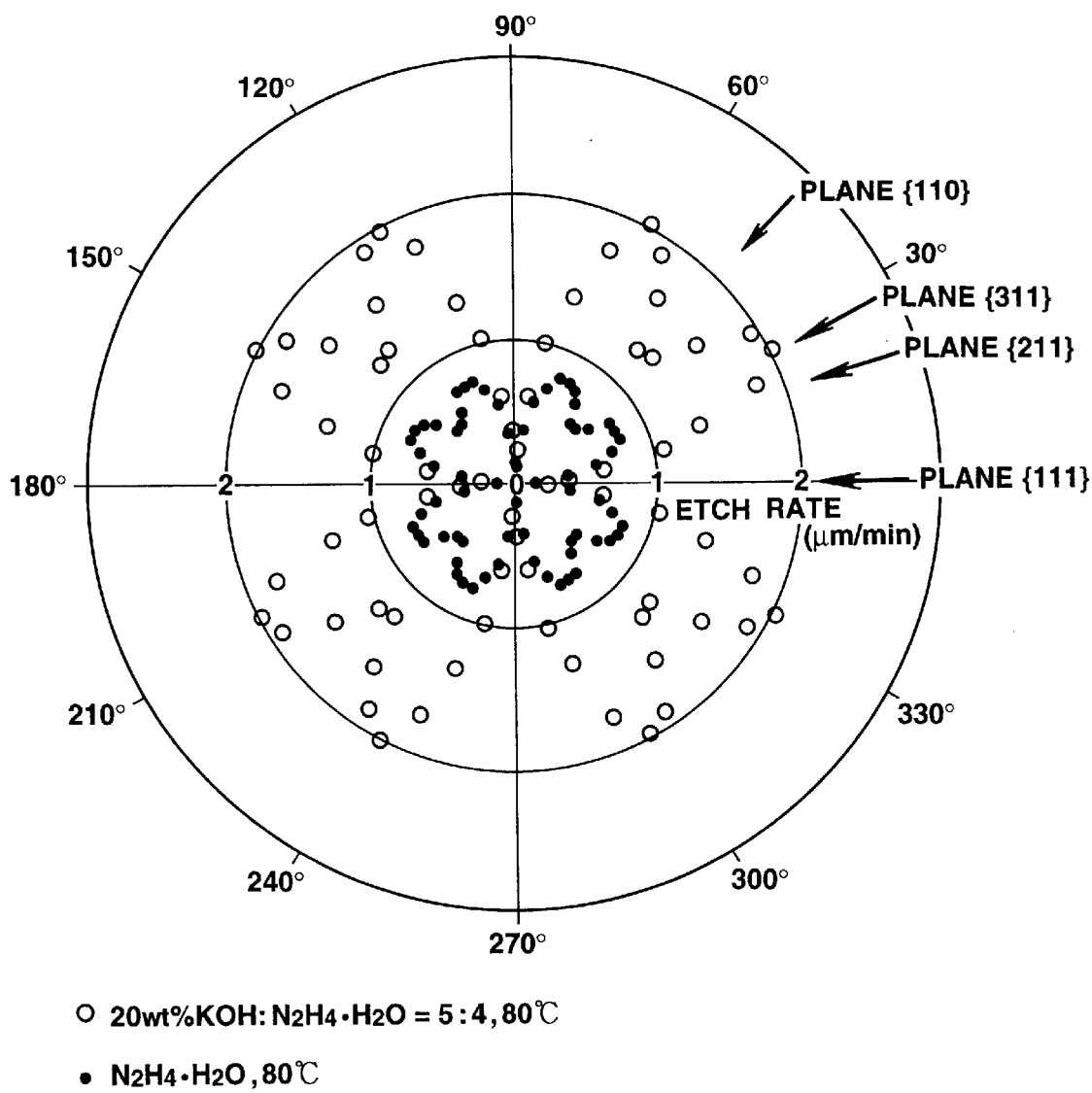
FIG. 16 is a diagram showing the dependency of etch rate on crystal surface orientation.

First, the crystal surface dependency of etch rate was measured by the present inventors by using the experimental etching apparatus as shown in FIG. 11 in which two etching solutions were used in which one was hydrazine hydrate, and the other was prepared by adding the aqueous solution of a metal hydroxide such as potassium hydroxide to hydrazine hydrate. More specifically, the latter etching solution was prepared by mixing hydrazine hydrate and the 20 wt % KOH aqueous solution in a volume ratio of 5:4. The result of this measurement is shown in FIG. 16, in which etching was carried out at 80° C. in the etching solution. The measured etch rate indicated in FIG. 16 is a so-called under-etching rate which is an etch rate projected onto the plane {100}. FIG. 16 demonstrates that the under-etching rate on a high degree of surface index, particularly on the plane {311} is higher in case of using the etching solution prepared by adding the metal hydroxide aqueous solution to the hydrazine hydrate than that in case of using only hydrazine hydrate as the etching solution.

Assuming that a micro-pyramid formed upon carrying out a certain etching step A is constituted of planes (111) each plane having each side having a dimension $L_{MP}$ ($\mu$m), the height of the micro-pyramid is given by $(1/\sqrt{2}) \cdot L_{MP}$ ($\mu$m). An etching step B which causes the micro-pyramid formed in the etching step A to disappear is studied using the etching solution by which formation of the micro-pyramid is not confirmed. Assuming that the etch rate at the plane {100} in the etching step B is $v_{\{100\}}$ ($\mu$m/min), the planes (100) come back by a distance $V_{\{100\}} \cdot t_{dis}$ ($\mu$m) upon lapse of a time $t_{dis}$ (min) after the initiation of the etching. At this time, the height of the micro-pyramid increases by the dimension $V_{\{100\}} \cdot t_{dis}$ ($\mu$m), and the dimension of each side of the plane (111) of the micro-pyramid increases by $\sqrt{2} \cdot v_{\{100\}} \cdot t_{dis}$ ($\mu$m). Assuming that the thus grown micro-pyramid gradually disappears from its summit upon the etching at the plane {311} having the highest etch rate in the etching step B, Eq. (2-10) is established.

$$\frac{L_{MP}}{\sqrt{2}} + V_{\{100\}} \cdot t_{dis} = \tan\theta_{\{311\}} \cdot v_{\{311\}} \cdot t_{dis} \quad (2\text{-}10)$$

In Eq. (2-10), $V_{\{311\}}$ indicates the etch rate which is obtained by projecting the etching at the plane {311} onto the plane {100}, this etch rate corresponding to the so-called under-etching rate (or a lateral etching rate or side etching rate). Accordingly, a capability of the etching solution used in the etching step B to cause micro-pyramid to disappear can be defined by a function represented by Eq. (2-11) which function takes a larger value as the amount of micro-pyramid disappearing per unit time is larger or the time for which a unit size of micro-pyramid disappears is shorter.

$$P_{dis} = \frac{L_{MP}}{t_{dis}} = \sqrt{2} \; (\tan\theta_{\{311\}} v_{\{311\}} - v_{\{100\}}) \quad (2\text{-}11)$$

This demonstrates the fact that the capability to cause micro-pyramid to disappear is larger as the under-etching rate $v_{\{311\}}$ is higher relative to an etch rate $v_{\{100\}}$ at which the etching bottom surface moves (or at which etching proceeds at the etching bottom surface). It is supposed that if $P_{dis}$ takes a large negative value, it is impossible to cause the micro-pyramid formed in the etching step A to disappear.

Figure 17:
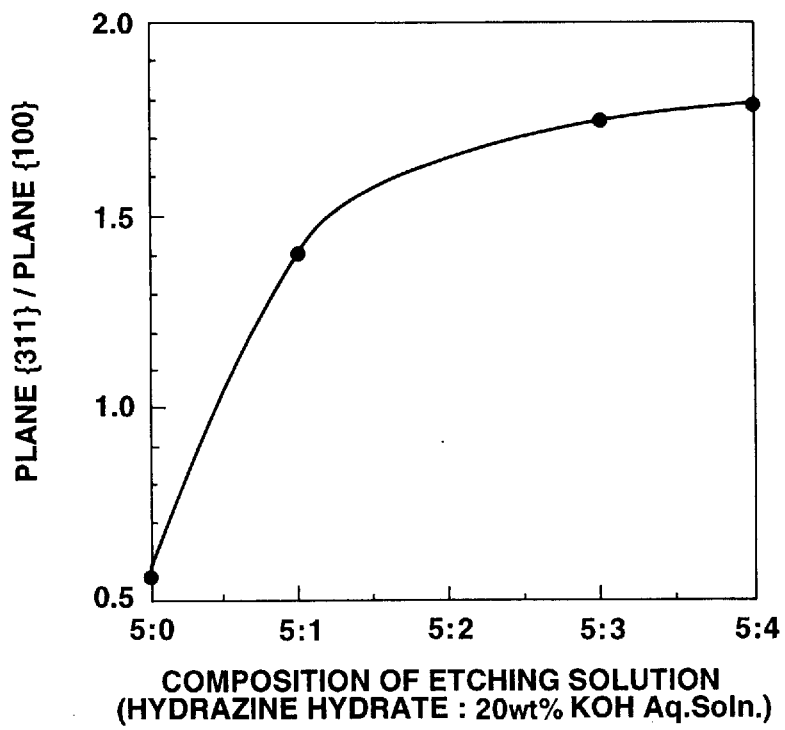
FIG. 17 is a graph showing the relationship between the ratio in etch rate at two planes and the composition of the etching solution.

FIG. 17 shows the ratio between the under-etching rate at the plane {311} and the etch rate at the plane {100} in the experimental etching apparatus used by the present inventors to accomplish the etching at 80° C. using the etching solution prepared by mixing the metal hydroxide aqueous solution to hydrazine hydrate, in which the composition of the etching solution indicates the volume ratio between hydrazine hydrate and 20 wt % KOH aqueous solution. Additionally, $P_{dis}$ defined by Eq. (2-11) is graphed in FIG. 18 in terms of the composition of the etching solution or the volume ratio between the hydrazine hydrate and the 20 wt % KOH aqueous solution.

Figure 18:
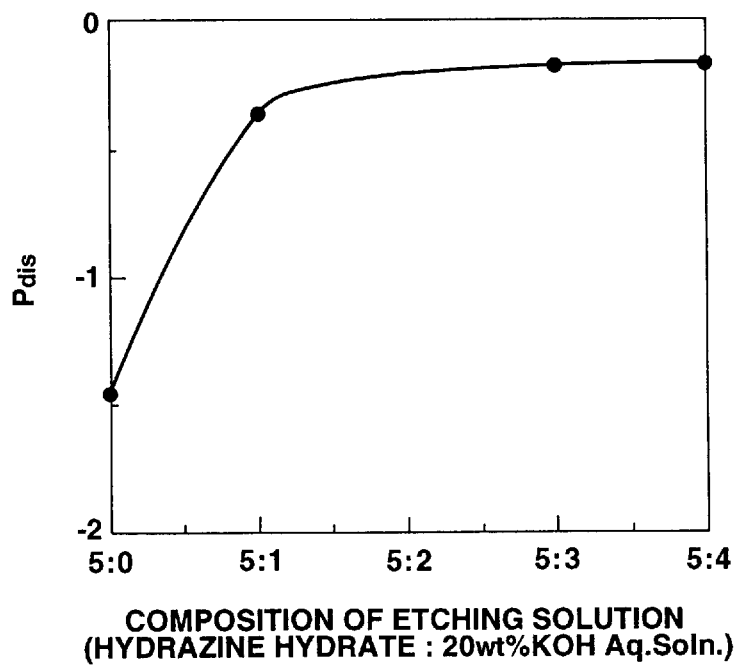
FIG. 18 is a graph showing the relationship between the capability of causing micro-pyramid to disappear and the composition of the etching solution.

FIG. 18 reveals that the capability to cause micro-pyramid to disappear is higher in case of using the etching solution prepared by mixing the metal hydroxide aqueous solution to hydrazine hydrate, than that in case of using only hydrazine hydrate as the etching solution (indicated at an etching solution composition of 5:0). In FIG. 18, $P_{dis}$ at the composition of 5:0 takes a negative value, which results from the fact that the analysis of disappearance of micro-pyramid is made using such a simplest model that disappearance of micro-pyramid is made starting from only the summit of micro-pyramid only under the lateral etching of the plane {311}; however, it is supposed that such micro-pyramid disappearance is, in fact, starts from the plural summits and is made under etching of the plural crystal surface orientations, so that the value of $P_{dis}$ shown in FIG. 18 is supposed to be shifted to a negative (minus) side relative to an actual value.

Figure 19:
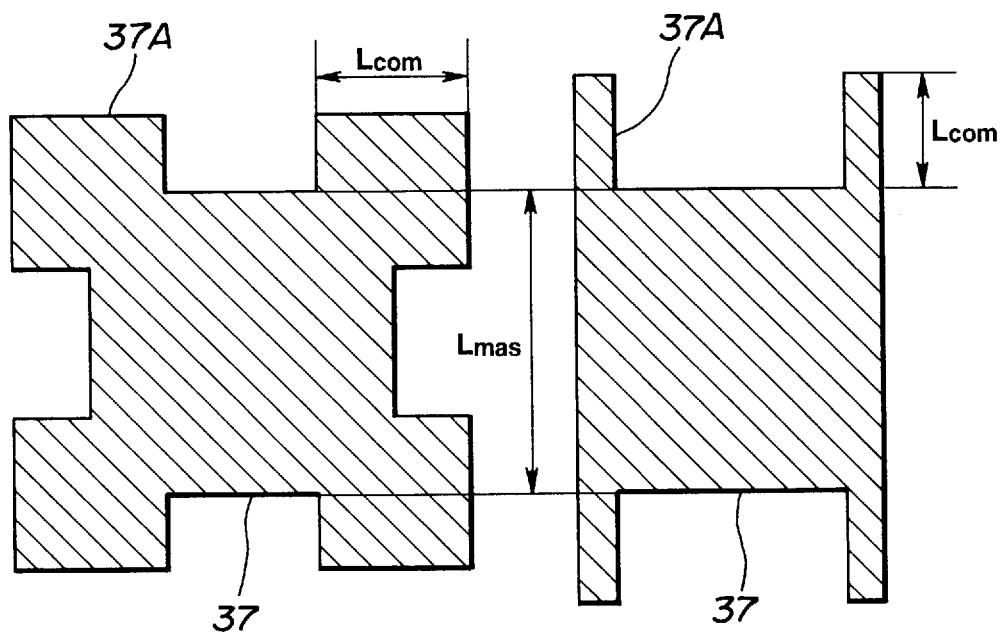
FIG. 19A is a plan view of an example of a back-side mask provided with a compensation pattern, to be used in a fifth embodiment of the etching process according to the present invention.
FIG. 19B is a plan view similar to FIG. 19A but showing another example of the back-side mask provided with another compensation pattern, to be used in the fifth embodiment of the etching process according to the present invention.

FIGS. 19A and 19B illustrate a fifth embodiment of the etching process according to the present invention, which is similar to the third and fourth embodiments. In this embodiment, a semiconductor acceleration sensor is produced under the etching process.

Figure 20:
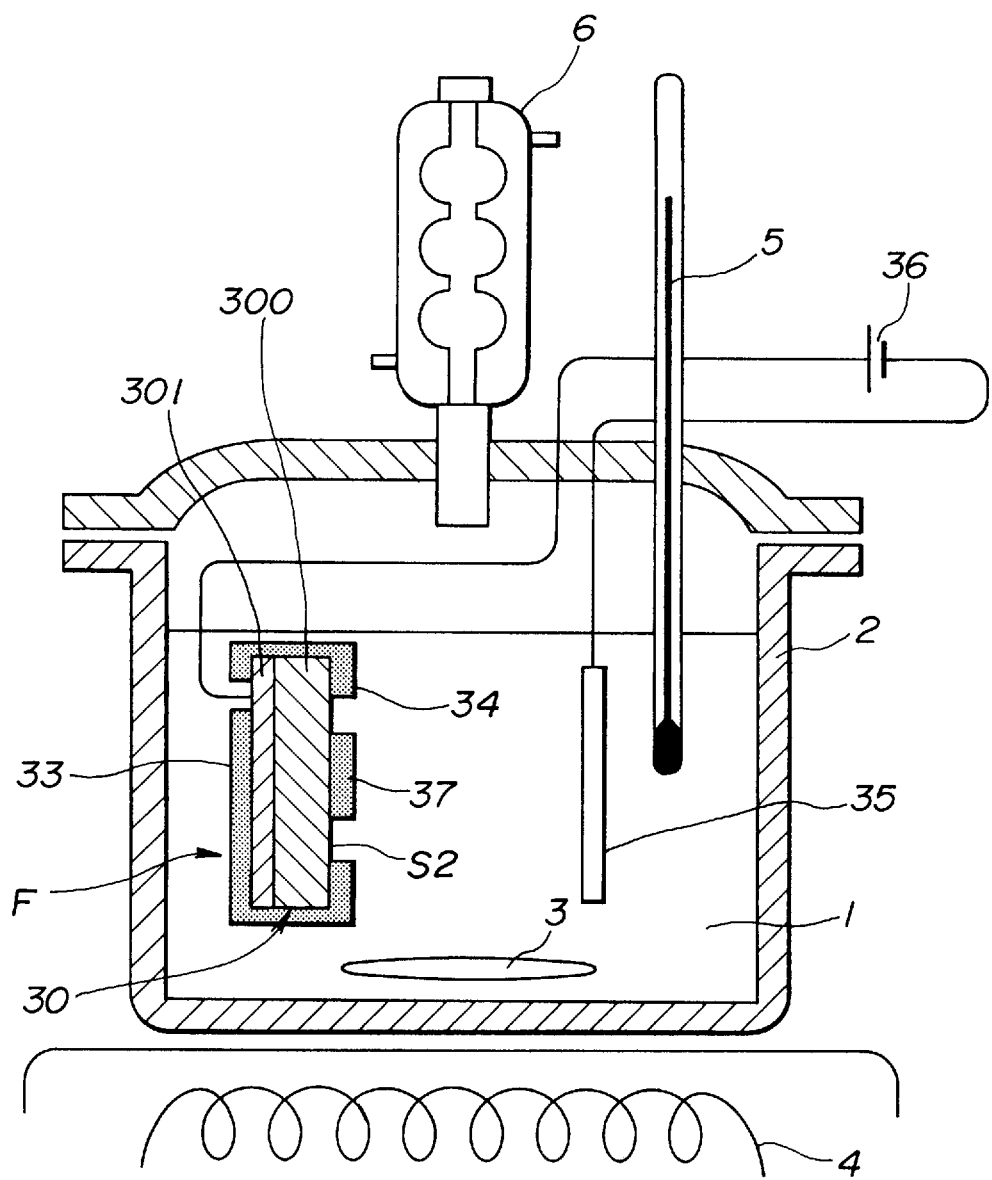
FIG. 20 is a schematic illustration of an etching apparatus to be used in the fifth embodiment etching process.

First, the fabricated structure F including the epitaxial substrate 30 as shown in FIGS. 15A and 20 is prepared. The epitaxial substrate 30 includes the p-type silicon substrate 300. The n-type epitaxial layer 301 is formed on the silicon substrate 300. The epitaxial substrate 30 is covered with the silicon oxide films 33, 34. A back-side mask 37 for forming a weight of the semiconductor acceleration sensor is formed on the back-side surface S2 of the silicon substrate 300.

Next, the structure F is dipped in the etching solution in the etching apparatus of FIG. 11 in which the etching solution is hydrazine hydrate. The etching is deeply made to reach the vicinity of the interface between the p-type silicon substrate 300 and the n-type epitaxial layer. This is the pre-etching step. After the pre-etching, the etched structure F has an etching depression (not identified) which is defined by the etching side wall 40 of the plane {111} which is characteristic in an alkali anisotropic etching, and the etching bottom surface 21, as shown in FIG. 15B. The etching bottom surface 21 includes the flat surface 22 of the plane {100}, and the gently sloping surface 23 of the plane {111} which surface is continuous to the etching side surface 40. Many micro-pyramids 24 are formed on the etching bottom surface 21.

Subsequently, the structure F shown in FIG. 15B is dipped in the etching solution 1 shown in FIG. 20 to be subjected to the final or electrochemical etching using the etching solution 1 prepared by mixing hydrazine hydrate and the 20 wt % KOH aqueous solution in a volume ratio of 5:4. The etching is carried out at 80° C. in etching solution temperature, in which the etching is electrochemically terminated so that the etching bottom surface 21 reaches to the interface of the p-n junction 100. At this final etching step, the micro-pyramids 24 are disappeared thereby to form the flat etching stopping surface 52 at which the etching is stopped. As a result, a highly precise beam of the n-type epitaxial layer 301 is formed as shown in FIG. 15C.

Next, a compensation pattern 37A to be used in the fifth embodiment etching process will be discussed. The compensation pattern 37A is to be added to the back-side mask 37 as shown in FIGS. 19A and 19B.

First, discussion will be made on a case of the conventional (single) electrochemical etching process. An example of the compensation pattern 37A is shown in FIG. 19A, in which a generally square-shaped small mask-like member (no numeral) is formed or added to each of the four corner sections of the back-side mask 37 of the square shape. Such compensation pattern 37A is, for example, disclosed in a technical literature "Corner Undercutting in Anisotropically Etched Isolation Contours", M. M. Abu-Zeid, J. Electrochem. Soc., Vol. 131, No. 9, pages 2138–2142, 1984.

The size $L_{com}$ (μm) of the compensation pattern 37A will be estimated. Assuming that the thickness of the silicon substrate 300 (reaching the p-n junction interface) is $D_{pn}$ (μm), a time $t_{etch}$ (min) required for completing the etching is given by Eq. (2-12).

$$t_{etch} = \frac{D_{pn}}{v_{\{100\}}} \tag{2-12}$$

Assume that the side-etching at a surface where the side-etching rate is the highest is initiated from a point at the outer-most periphery of the compensation pattern 37A, and a part (of the silicon substrate 300) corresponding to the compensation pattern 37A just disappears at the termination of the etching in an etching step using the back-side mask 37 provided with the compensation pattern 37A. Here, Eq. (2-13) is established using the side-etching rate $v_{\{i\}}$ at the surface where the side-etching rate is the highest, and an angle $\theta_i$ formed between the above-mentioned plane {100} and a line <110> intersecting the plane.

$$\frac{L_{com}}{\sqrt{2}} = \frac{D_{pn}}{\cos(45° - \theta_i)} \cdot v_{\{i\}} \cdot t_{etch} \tag{2-13}$$

By eliminating $t_{etch}$ from Eqs. (2-12) and (2-13), Eq. (2-14) is obtained.

$$L_{com} = \frac{\sqrt{2}\, D_{pn}}{\cos(45° - \theta_i)} \cdot \frac{v_{\{i\}}}{v_{\{100\}}} \tag{2-14}$$

As apparent from Eq. (2-14), a larger size compensation pattern is required as a ratio between the etch rate of the side-etching and the etch rate at the etching surface S2 is larger.

Another example of the compensation pattern is shown in FIG. 19B. In this example, an elongate rectangular mask-like member (no numeral) is formed or added to each of the four corner sections of the back-side mask 37 of the square shape. Such a compensation pattern is disclosed, for example, in a technical literature "Development of Anisotropic Etching Techniques for Silicon Crystal for Semiconductor Sensor", Shimanoe et al, TOYOTA Technical Review, Vol. 42, No. 2, pages 68–75, Nov, 1992.

In case of using this compensation pattern, the size $L_{com}$ (μm) of the compensation pattern is given by Eq. (2-15) similarly to the above.

$$L_{com} = \frac{D_{pn}}{\sin\theta_i} \cdot \frac{v_{\{i\}}}{v_{\{100\}}} \tag{2-15}$$

Also in this case, a larger size compensation pattern is required as a ratio between the etch rate of the side-etching and the etch rate at the etching surface S2 is larger, as same as in the above case. Additionally, the order of the etching solutions in which order the size of the compensation pattern is minimized is different depending upon the shape of the compensation pattern.

Figure 21:
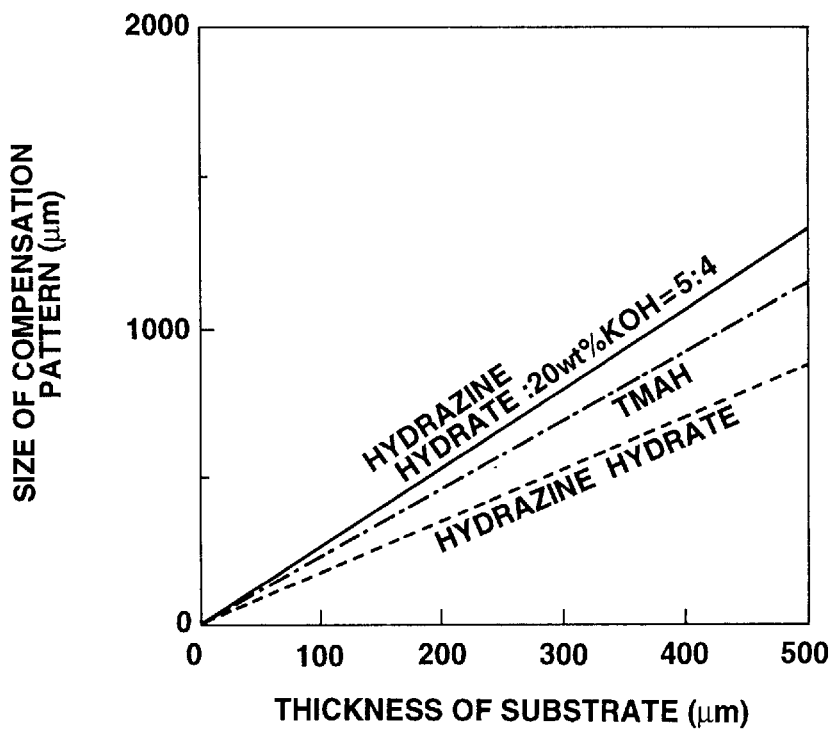
FIG. 21 is a graph showing the relationship between the thickness of a substrate to be etched and the size of the compensation pattern, in connection with the compensation pattern of FIG. 19A.
Figure 22:
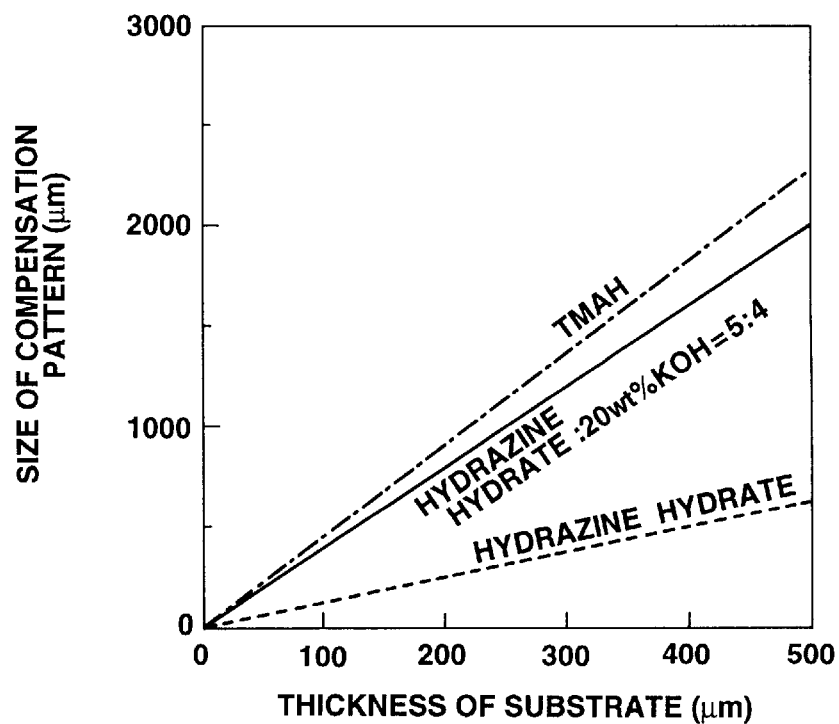
FIG. 22 is a graph showing the relationship between the thickness of a substrate to be etched and the size of the compensation pattern, in connection with the compensation pattern of FIG. 19B.

FIG. 21 shows the relationship between the required size $L_{com}$ of the compensation pattern 37A and the thickness $D_{pn}$ of the silicon substrate 300 in case of using the compensation pattern 37A shown in FIG. 19A, the relationship being calculated from Eq. (2-14). Similarly, FIG. 22 shows the same relationship in case of using the compensation patter 37A shown in FIG. 19B. The data in FIGS. 21 and 22 are obtained on the following assumption: In case of using hydrazine hydrate as the etching solution, the temperature of hydrazine hydrate is 80° C.; the surface where the side-etching etch rate is the highest is the plane {311}; the angle $\theta_i$ is 26.50; and the ratio between etch rate of the side-etching at the plane {311} and the etch rate at the plane {100} is 0.56. In case of using the etching solution prepared by mixing hydrazine hydrate and the 20 wt % KOH aqueous solution in a volume ratio of 5:4, the temperature of the etching solution is 80° C.; the surface where the side-etching etch rate is the highest is the plane {311}; the angle $\theta_i$ is 26.5°; and the ratio between etch rate of the side-etching at the plane {311} and the etch rate at the plane {100} is 0.56. The data in FIGS. 21 and 22 are obtained on the following assumption: In case of using "TMAH (tetramethyl ammonium hydroxide)" as the etching solution, the surface where the side-etching etch rate is the highest is the plane {211}; the angle $\theta_i$ is 18.5°; and the ratio between etch rate of the side-etching at the plane {211} and the etch rate at the plane {100} is 1.45, which are estimated from the above-mentioned technical literature written by Shimanoe et al.

It will be apparent from FIGS. 21 and 22, that there is a tendency that the etch rate in lateral-etching at the high degree of surface is high, as guessed from the fact discussed in connection with the micro-pyramid disappearing mechanism. It will be understood that a large-size compensation pattern is required in the conventional single electrochemical etching process in case of using the above-mentioned etching solutions. For example, assume that a semiconductor acceleration sensor is designed to have an area of 3 mm² in case that the amount of side-etching is nearly one which is obtained by using hydrazine hydrate. In order to obtain such a semiconductor acceleration sensor upon making an etching using an etching solution which does not allow micro-pyramid to be formed, the area of the semiconductor acceleration sensor is increased to 5 mm² under the action of an enlarged compensation pattern which is increased by 500 μm, so that the area of the semiconductor acceleration sensor increases by 2.8 times of that of 3 mm². Accordingly, the number of chips taken out from a wafer is unavoidably reduced to a value corresponding to 1/2.8 of that in case having the area of 3 mm², and therefore the cost of each chip becomes 2.8 times in case having the area of 3 mm². Thus, it is assumed that a chip is designed small-sized thereby lowing the chip cost, with the amount of side-etching nearly corresponding to one obtained by using hydrazine hydrate. However, in fact, it is very difficult to produce the semiconductor acceleration sensor at a high efficiency by using the conventional (single) electrochemical etching process because of the micro-pyramid formation problem.

In this regard, according to the third to fifth embodiments of the etching process of the present invention, the size of the compensation pattern can be minimized because the time required for the electrochemical etching is excessively shortened, while obtaining the final etching surface which is not provided with micro-pyramids. This will be discussed in detail hereinafter.

For example, in case of using the compensation pattern shown in FIG. 19A, the size $L_{com,imp}$ of the compensation pattern in the third to fifth embodiments is given by Eq. (2-16) using the highest etch rate $v_{\{i\},pri}$ of side-etching and the etch rate $v_{\{100\},pri}$ at the etching surface S2 in the pre-etching step, and the highest etch rate $v_{\{i\},fin}$ of side-etching and the etch rate $v_{\{100\},fin}$ at the etching surface S2 in the final etching step.

$$L_{com,imp} = \frac{\sqrt{2}\, D_{pri}}{\cos(45° - \theta_i)} \cdot \frac{v_{\{i\},pri}}{v_{\{100\},pri}} + \frac{\sqrt{2}\, (D_{pn} - D_{pri})}{\cos(45° - \theta_i)} \cdot \frac{v_{\{i\},fin}}{v_{\{100\},fin}} \tag{2-16}$$

Similarly, the size $L_{com,imp}$ of the compensation pattern in case of using the compensation pattern shown in FIG. 19B in the third and fifth embodiments of the present invention is given by Eq. (2-17).

$$L_{com,imp} = \frac{D_{pri}}{\sin\theta_i} \cdot \frac{v_{\{i\},pri}}{v_{\{100\},pri}} + \frac{D_{pn} - D_{pri}}{\sin\theta_i} \cdot \frac{v_{\{i\},fin}}{v_{\{100\},fin}} \quad (2\text{-}17)$$

The relationship between $L_{com,imp}$ calculated by Eqs. (2-16) and (2-17) and Dpri is graphed in FIG. 23, regarding to the cases of using the compensation patterns shown in FIGS. 19A and 19B. The calculation in Eqs. (2-16) and (2-17) uses conditions in which $D_{pn}$ is 500 mm; the etching solution in the pre-etching step is hydrazine hydrate; the etching solution in the final etching step is one prepared by mixing hydrazine hydrate and the 20 wt % KOH aqueous solution in a volume ratio of 5:4; and the temperature of the etching solution is 80° C.

Figure 23:
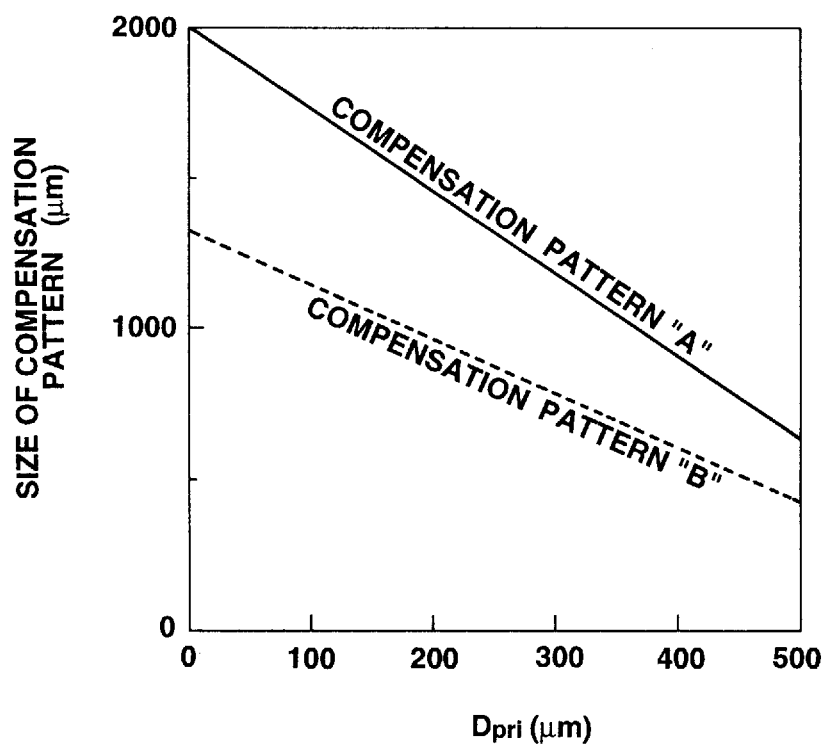
FIG. 23 is a graph showing the relationship between the depth of the pre-etching and the size of the compensation pattern.

In FIG. 23, the size of the compensation pattern at $D_{pri}$=0 μm corresponds to one required in case of carrying out the etching under the conventional (single) electrochemical etching using the etching solution which does not allow micro-pyramid to be formed. In any compensation pattern, the required size of the compensation pattern linearly decreases as the etching depth (depth of the depression formed by the etching) increases in the pre-etching step. If the pre-etching is made to such a degree that the etching depth reaches 450 (μm), the size of the compensation pattern in the embodiments of the present invention is generally the same as that required in case of carrying out the conventional (single) electrochemical etching process using hydrazine hydrate (low in capability of making the side-etching) as the etching solution. In other words, according to the third to fifth embodiments of the present invention, not only the etching termination surface (at which the etching is terminated) which is not provided with micro-pyramid can be obtained, dissimilarly from that in case of using only hydrazine hydrate as the etching solution, but also the required size of the compensation pattern is generally the same as that required in case using only hydrazine hydrate as the etching solution. This is very advantageous from the view point of a recent trend in which the thickness of the semiconductor substrate has been increased according to the increased diameter (such as 3, 4, 5, 6, 8 and 12 inches) of the semiconductor substrate.

It is to be noted that there is a limit in the size of the compensation pattern shown in FIG. 19A, in which the limit in size is established in a value of the size at which the generally square-shaped sections of the compensation patterns come to a condition in which they lie one upon another. Accordingly, the size $L_{com,imp}$ of the compensation pattern is given by Eq. (2-18).

$$L_{com,imp} > \frac{L_{mas}}{2} \quad (2\text{-}18)$$

Figure 24:
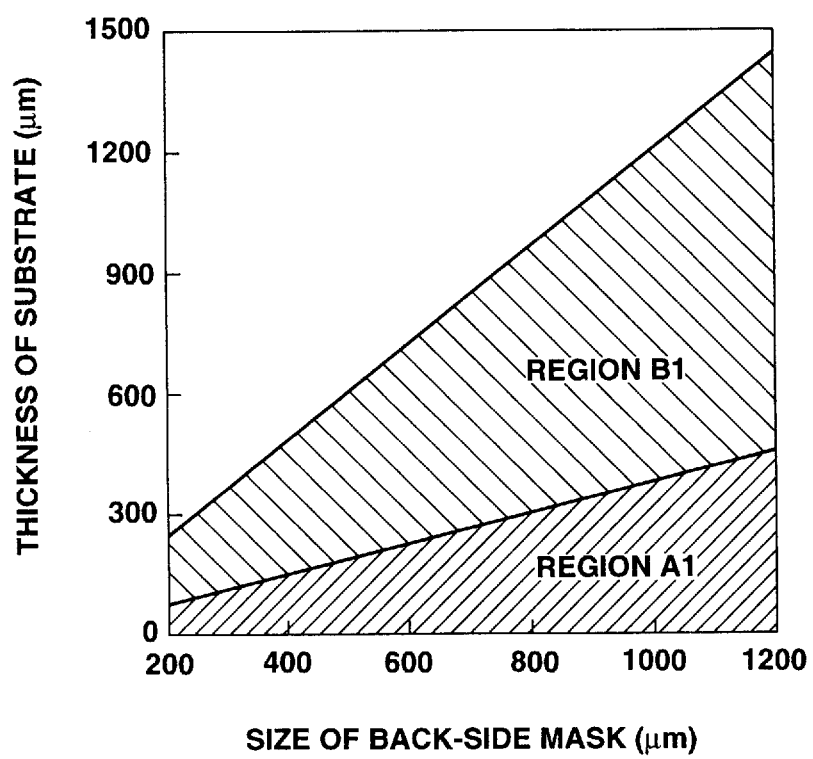
FIG. 24 is a graph showing the relationship between the size of the back-side mask and the thickness of the substrate.

FIG. 24 shows the relationship between the thickness ($D_{pn}$) of the silicon substrate 300 and the size ($L_{mas}$ in FIGS. 19A and 19B) of the back-side mask 37 for forming a weight of the semiconductor acceleration sensor on the assumption that $D_{pn}$ is 500 μm resulted from Eqs. (2-16) and (2-17), in case of the conventional (single) electrochemical etching process and in case of the embodiments of the present invention including the pre-etching step using hydrazine hydrate as the etching solution and the final etching step using the etching solution prepared by mixing the hydrazine hydrate and the 20 wt % KOH aqueous solution in a volume ratio of 5:4. FIG. 24 depicts a tendency that the size of the compensation pattern is enlarged thereby to make difficult formation of a small-sized weight of the semiconductor acceleration sensor as the thickness of the silicon substrate 300 increases. In a region "B1" in FIG. 24, the weight of the semiconductor acceleration sensor cannot be formed in case of employing the conventional (single) electrochemical etching but can be formed in case of employing the third to fifth embodiment etching processes of the present invention. In a region "A1", the weight can be formed in the both cases of employing the conventional (single) electrochemical etching process and the third to fifth embodiment etching process of the present invention. Thus, it will be apparent from FIG. 24, that the third to fifth embodiment etching process of the present invention is wider in range where production of a semiconductor device can be accomplished, than the conventional single electrochemical etching process, thereby providing a high degree of freedom in designing the semiconductor device.

While hydrazine hydrate, the mixture of hydrazine hydrate and the 20 wt % KOH aqueous solution, and TMAH (in FIG. 21) have been shown and described as examples of the etching solution in the discussion of third to fifth embodiment etching processes, it will be understood that the etching solutions to be used in the third to fifth embodiment etching processes may not be limited to them or a combination of them and therefore may be ones other than the above-mentioned. The hydrazine hydrate is an example of an etching solution system with which many micro-pyramids are formed at the etching bottom surface while the etch rate of side-etching is low. The mixture of hydrazine hydrate and the KOH aqueous solution and TMAH are examples of an etching solution system in which the etch rate of side-etching is high while no micro-pyramid can be formed. In case of using hydrazine hydrate which hardly erode an oxide film, an etching treatment time in the final etching step is short, and therefore it is possible to use the oxide film as the back-side mask even in case that an etching solution (such as a potassium hydroxide aqueous solution) which can erode the oxide film to some degree is used in the final etching step.

Although the pre-etching step and the final etching step have been shown and described as being carried out successively in the third to fifth embodiments, it will be understood that a further processing step may be carried out between the pre-etching and final etching steps. While the pre-etching step has been described as consisting of a single step, it will be appreciated that the pre-etching step consists of a plurality of steps.

While the etching processes of the third and fifth embodiments have been shown and described as including the electrochemical etching step carried out by impressing a voltage on the n-type epitaxial layer and electrochemically terminating an etching reaction at the interface of the p-n junction, it will be appreciated that the principle of the present invention may be applied to other electrochemical treatment processes such as formation of a porous silicon under anodic oxidation of a silicon substrate.

Although the etching solution containing hydrazine hydrate as the main component has been shown and described, it will be understood that the etching solution may be a variety of other alkali anisotropic etching solutions, for example, aqueous solutions of alkali metal hydroxide such as LiOH, NaOH, RbOH and/or CsOH, anhydrous hydrazine, $NH_2OH$, $NR_4OH$ (R: alkyl group) such as TMAH (tetramethyl ammonium hydroxide), a EDP (ethylenediamine pyrocatechol)—water system solution. Additionally, the etching solution may be a hydrofluoric acid system etching solution (containing hydrofluoric acid as the main component). Further, the etching solution may contains other components such as surface active agents and/or alcohols.

Although the discussion of the present invention has been made on the etching process of the silicon semiconductors, it will be understood that the object of the etching process may be a compound semiconductor such as gallium arsenide, metal, silicide, and a composite of the silicon semiconductor and another semiconductor or quartz crystal.

What is claimed is:

1. An etching process for a semiconductor, comprising the following steps:
   preparing an alkali system etching solution containing at least hydrazine ($N_2H_4$), a metal hydroxide (MOH), and water ($H_2O$), the alkali system etching solution containing the metal hydroxide in an amount of not less than 0.3% by weight; and
   dipping the semiconductor in the etching solution to etch the semiconductor.

2. An etching process as claimed in claim 1, wherein said metal hydroxide is potassium hydroxide.

3. An etching process as claimed in claim 2, wherein the etching solution preparing step includes determining a composition of the alkali system etching solution within a range enclosed by a first line connecting a point (64, 36, 0) and a point (0, 36, 64), a second line connecting a point (32, 68, 0) and a point (32, 0, 68), a third line connecting a point (0, 99.7, 0.3) and a point (99.7, 0, 0.3) and a fourth line connecting a point (0, 90, 10) and a point (90, 0, 10), in a constitutional diagram of a ternary (three component) system of hydrazine ($N_2H_4$)-water ($H_2O$)-potassium hydroxide (KOH), in which a total amount of hydrazine hydrate, water and potassium hydroxide represented in % by weight is 100.

4. An etching process as claimed in claim 2, further comprising the step of forming a corrosion-resistant mask on the semiconductor, and the step of controlling an etching shape of an etching made under the mask by controlling the composition of the etching solution.

5. An etching process as claimed in claim 2, further comprising the step of preparing the semiconductor having a p-type region and a n-type region, and the step of applying such an electric potential to the n-type region as to prevent the n-type region from dissolving so as to carry out the etching of the semiconductor.

6. An etching process as claimed in claim 2, wherein the etching solution preparing step includes preparing the etching solution containing potassium hydroxide in an amount of not less than 8.9% by weight.

7. An etching process as claimed in claim 2, wherein the etching solution preparing step includes determining a firing point of the etching solution according to a ratio between hydrazine and water, and setting the firing point at a level higher than an etching temperature of the etching solution at which temperature etching is carried out.

8. An etching process as claimed in claim 2, wherein the etching solution preparing step includes setting a ratio between hydrazine and water at a value which prevents a firing point of the etching solution from existing, which firing point is determined by the ratio between hydrazine and water.

9. An etching process as claimed in claim 1, wherein the semiconductor is a silicon semiconductor.

10. An etching process for a semiconductor, comprising the following steps:
    carrying out an etching of the semiconductor without application of a voltage to the semiconductor so as to accomplish a first etching step; and
    carrying out an electrochemical etching of the semiconductor by applying a voltage to the semiconductor after the first etching step so as to accomplish a second etching step.

11. An etching process as claimed in claim 10, wherein the first etching step includes dipping the semiconductor in a first etching solution, wherein the second etching step includes dipping the semiconductor in a second etching solution, in which the voltage is applied between the semiconductor and a counter electrode dipped in the second etching solution.

12. An etching process as claimed in claim 11, wherein said first etching solution is hydrazine hydrate, wherein said second etching solution is a mixture of hydrazine hydrate and an aqueous solution of a compound.

13. An etching process as claimed in claim 12, wherein said second etching solution includes at least hydrazine ($N_2H_4$), a metal hydroxide (MOH), and water ($H_2O$), the etching solution containing the metal hydroxide in an amount of not less than 0.3% by weight.

14. An etching process as claimed in claim 13, wherein the metal hydroxide is potassium hydroxide.

15. An etching process as claimed in claim 11, wherein the second etching solution has a firing temperature which is so low as to prevent the second etching solution from firing during the electrochemical etching.

16. An etching process as claimed in claim 11, wherein the second etching step includes dipping a plurality of semiconductor in the second etching solution to be simultaneously etched.

17. An etching process as claimed in claim 10, wherein the semiconductor is a semiconductor substrate.

18. An etching process for a semiconductor, comprising the following steps:
    carrying out an etching of the semiconductor without application of a voltage to the semiconductor so as to accomplish a first etching step, the first etching step including dipping the semiconductor in hydrazine hydrate; and
    carrying out an electrochemical etching of the semiconductor by applying a voltage to the semiconductor after the first etching step so as to accomplish a second etching step, the second etching step including dipping the semiconductor in an alkali system etching solution containing at least hydrazine ($N_2H_4$), potassium hydroxide (KOH), and water ($H_2O$), the alkali system etching solution containing potassium hydroxide in an amount of not less than 0.3% by weight.

* * * * *